(12) United States Patent
Fujimura et al.

(10) Patent No.: US 12,255,071 B2
(45) Date of Patent: Mar. 18, 2025

(54) GRINDING APPARATUS

(71) Applicant: DISCO CORPORATION, Tokyo (JP)

(72) Inventors: Satoru Fujimura, Tokyo (JP); Kyohei Ichiishi, Tokyo (JP); Yujiro Sudo, Tokyo (JP)

(73) Assignee: Disco Corporation, Tokyo (JP)

( * ) Notice: Subject to any disclaimer, the term of this patent is extended or adjusted under 35 U.S.C. 154(b) by 641 days.

(21) Appl. No.: 17/645,334

(22) Filed: Dec. 21, 2021

(65) Prior Publication Data

US 2022/0199407 A1 Jun. 23, 2022

(30) Foreign Application Priority Data

Dec. 23, 2020 (JP) .................. 2020-213681

(51) Int. Cl.
| | | |
|---|---|---|
| *H01L 21/304* | (2006.01) | |
| *B24B 7/22* | (2006.01) | |
| *B24B 49/04* | (2006.01) | |
| *H01L 21/66* | (2006.01) | |
| *H01L 21/78* | (2006.01) | |

(52) U.S. Cl.
CPC ............ *H01L 21/304* (2013.01); *B24B 7/228* (2013.01); *B24B 49/04* (2013.01); *H01L 21/78* (2013.01); *H01L 22/12* (2013.01)

(58) Field of Classification Search
CPC ... B24B 7/228; B24B 37/005; B24B 37/0053; B24B 37/04; B24B 37/042; B24B 37/10; B24B 37/105; B24B 49/12; B24B 49/02; B24B 49/04; H01L 21/304; H01L 21/78
See application file for complete search history.

(56) References Cited

U.S. PATENT DOCUMENTS

| | | | | |
|---|---|---|---|---|
| 2019/0152019 A1* | 5/2019 | Hirata | ..................... | C30B 29/36 |
| 2019/0221436 A1* | 7/2019 | Hirata | ................... | H01L 21/304 |
| 2019/0287801 A1* | 9/2019 | Yamamoto | ........ | H01L 21/67092 |

FOREIGN PATENT DOCUMENTS

| | | | | |
|---|---|---|---|---|
| DE | 102019200383 A1 * | 7/2019 | ......... | B23K 26/0006 |
| JP | 2006021264 A | 1/2006 | | |
| JP | 2018049913 A | 3/2018 | | |
| JP | 2019012765 A | 1/2019 | | |

OTHER PUBLICATIONS

Japanese Patent Application [JP 2020-213681 A]: English translation of Notice for Reasons of Refusal, Jun. 12, 2024 (3 pages).

* cited by examiner

*Primary Examiner* — Joel D Crandall
(74) *Attorney, Agent, or Firm* — Greer, Burns & Crain, Ltd.

(57) ABSTRACT

A grinding apparatus includes a holding table that holds a wafer, a grinding unit that grinds an exposed surface of the wafer held by the holding table, a detecting unit that detects a physical quantity used for determination of the state of exposure of a separation surface of the wafer, and a control unit having an exposure determining unit that determines the state of exposure of the separation surface on the basis of the physical quantity detected by the detecting unit.

9 Claims, 10 Drawing Sheets

GRINDING APPARATUS

BACKGROUND OF THE INVENTION

Field of the Invention

The present invention relates to a grinding apparatus that grinds a separation surface of a wafer separated from an ingot.

Description of the Related Art

The following generation method of a wafer is known. Irradiation with a laser beam is executed in such a manner that the laser beam is focused on a position that is inside an ingot and is at a depth corresponding to the thickness of the desired wafer, and a processing mark is formed. In addition, a separation layer that horizontally extends from this processing mark is formed, and the wafer is separated from the ingot with use of the separation layer as the starting point. In the wafer generated by this kind of method, recesses and projections are formed in the separation surface on the separation layer side. Therefore, the recesses and projections of the separation surface are removed through, for example, grinding of the separation surface after the separation of the wafer from the ingot. In order to execute this kind of grinding processing, a grinding apparatus is used (for example, refer to Japanese Patent Laid-open No. 2018-049913 and Japanese Patent Laid-open No. 2006-021264).

SUMMARY OF THE INVENTION

However, with the grinding apparatus described in the above-mentioned Japanese Patent Laid-open No. 2018-049913 and Japanese Patent Laid-open No. 2006-021264, when an operator manually houses the separated wafer in a cassette, there is a fear that the operator houses the wafer with the wafer reversed upside down by mistake and the surface opposite to the separation surface is ground.

Therefore, the present invention intends to provide a grinding apparatus that can decrease the possibility of grinding of a surface opposite to a separation surface in a wafer.

In accordance with an aspect of the present invention, there is provided a grinding apparatus that grinds a separation surface having recesses and projections in a wafer generated by being separated from an ingot. The grinding apparatus includes a holding table that holds the wafer, a grinding unit that grinds an exposed surface of the wafer held by the holding table, a detecting unit that detects a physical quantity used for determination of a state of exposure of the separation surface, and a control unit having an exposure determining unit that determines the state of exposure of the separation surface on the basis of the physical quantity detected by the detecting unit.

Preferably, the detecting unit has an upper surface height detector that measures an upper surface height of the wafer held by the holding table, and the exposure determining unit determines that the state of exposure is an abnormal state in which the separation surface is not exposed, when a difference in the upper surface height among a plurality of places obtained by measurement of the plurality of places by the upper surface height detector is less than a threshold.

Moreover, preferably, the detecting unit has a pressure gauge that measures the negative pressure of a suction path when the wafer is to be sucked by a holding surface of the holding table, and the exposure determining unit determines that the state of exposure is an abnormal state in which the separation surface is not exposed, when the negative pressure measured by the pressure gauge when the wafer is sucked is less than a threshold.

Further, preferably, when it is determined that the state of exposure is the abnormal state by the exposure determining unit, the control unit informs an operator of the determination of the abnormal state.

Further, preferably, the grinding apparatus further includes a position adjustment unit on which the wafer is to temporarily be placed. The detecting unit has a light projecting part that irradiates either one of surfaces of the wafer temporarily placed on the position adjustment unit with light and a light receiving part that receives reflected light reflected by the wafer. When the amount of light received by the light receiving part is less than a threshold, the exposure determining unit determines that the surface irradiated with the light by the light projecting part is the separation surface and, on the basis of a result of the determination, determines whether or not the separation surface is exposed when the wafer is held by the holding table.

Further, preferably, the grinding apparatus further includes a cassette setting pedestal on which a cassette capable of housing a plurality of the wafers is set and a conveying unit including at least one conveying arm that conveys the wafer from the cassette to the holding table. The detecting unit has a light projecting part that is set on the conveying unit and irradiates either one of surfaces of the wafer with light and a light receiving part that is set on the conveying unit and receives reflected light reflected by the wafer. When the amount of light received by the light receiving part is less than a threshold, the exposure determining unit determines that the surface irradiated with the light by the light projecting part is the separation surface and, on the basis of a result of the determination, determines whether or not the separation surface is exposed when the wafer is held by the holding table.

Furthermore, preferably, the conveying arm has a holding surface that holds the wafer, an arm part connected to the holding surface, and a drive part that is set in the arm part and is capable of inverting the orientation of the holding surface. The control unit inverts the orientation of the holding surface before placing the wafer on the holding table when the exposure determining unit determines that the separation surface is not exposed.

According to the grinding apparatus in accordance with the aspect of the present invention, the possibility of grinding a surface opposite to a separation surface in a wafer can be decreased.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Embodiments of the present invention will be described in detail below with reference to the accompanying drawings. The present invention is not limited by contents described in the following embodiments. Moreover, what can easily be conceived of by those skilled in the art and what are substantially the same are included in constituent elements described below. In addition, configurations described below can be combined as appropriate. Further, various kinds of omission, replacement, or change of a configuration can be carried out without departing from the gist of the present invention.

First Embodiment

Figure 1:
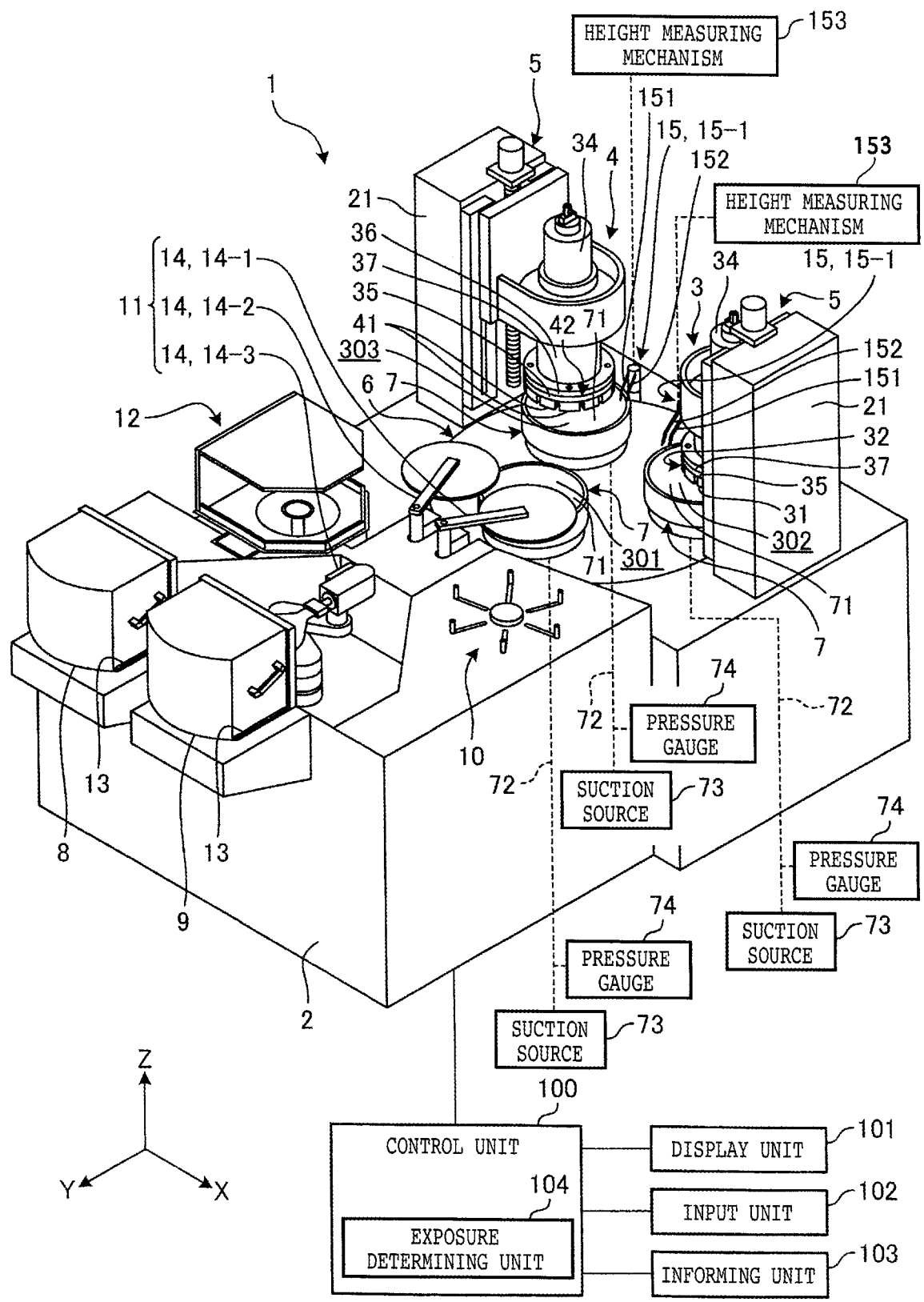
FIG. 1 is a perspective view illustrating a configuration example of a grinding apparatus according to a first embodiment.
Figure 2:
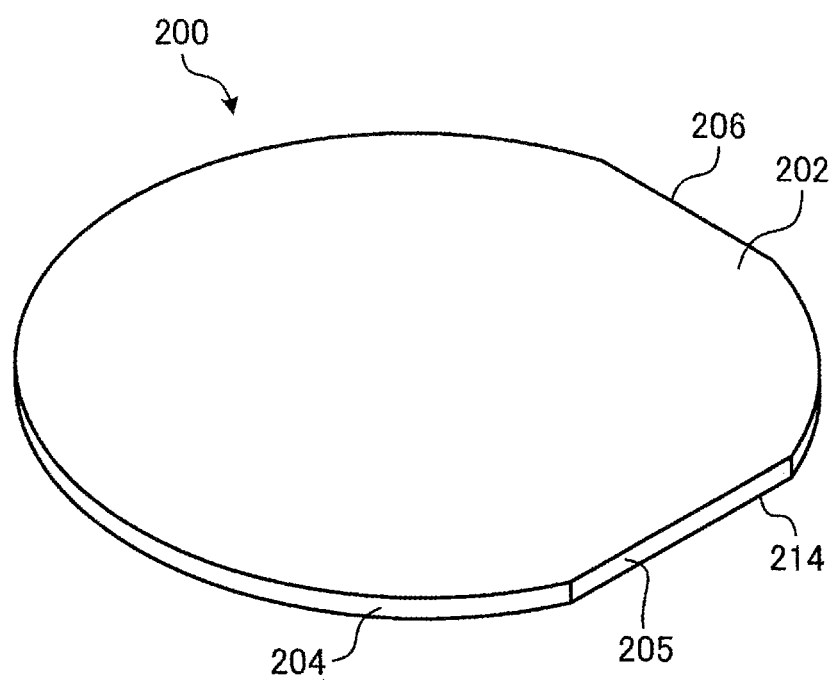
FIG. 2 is a perspective view of a wafer that is a processing target of the grinding apparatus according to the first embodiment.
Figure 3:
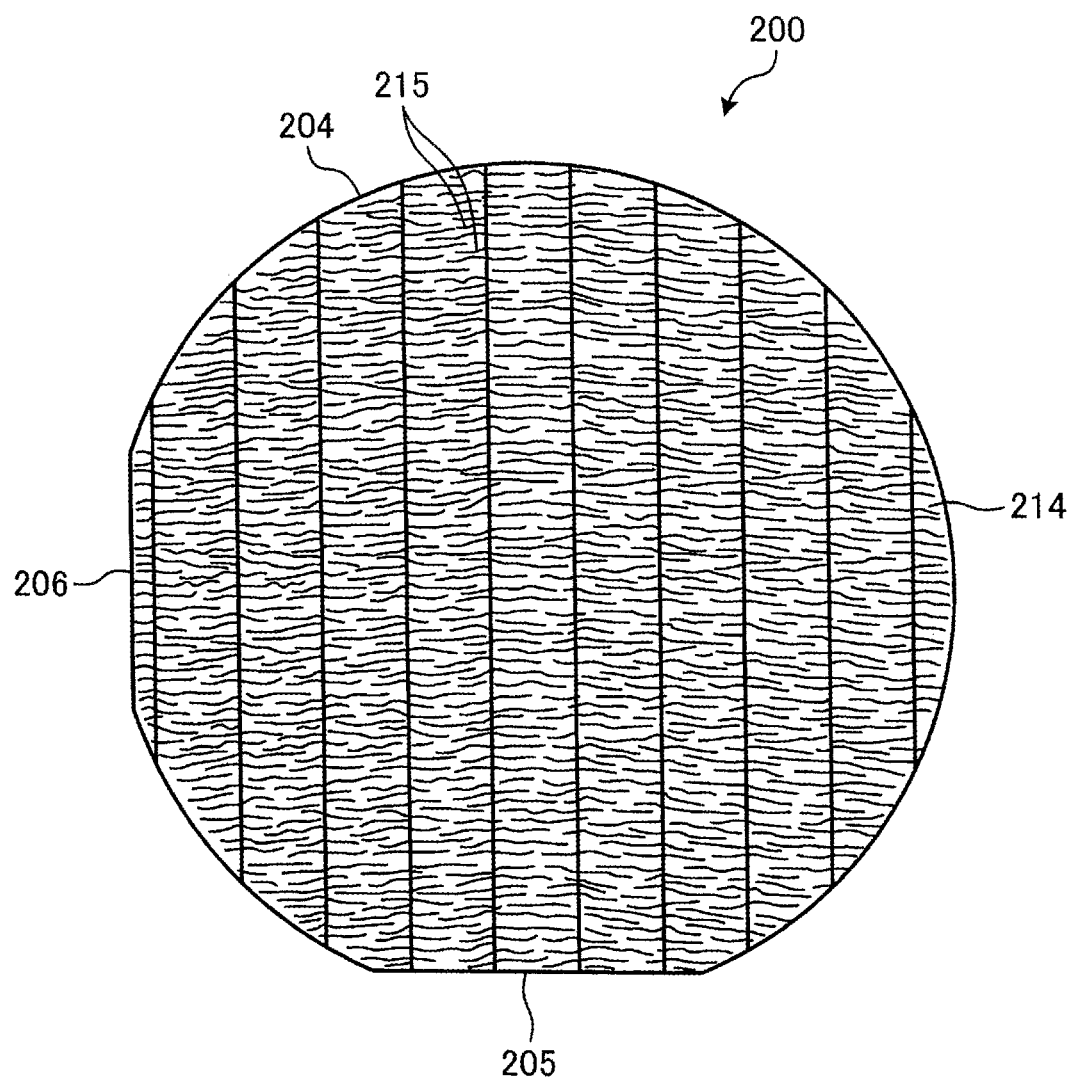
FIG. 3 is a plan view of the wafer illustrated in FIG. 2 as viewed from the lower side.
Figure 4:
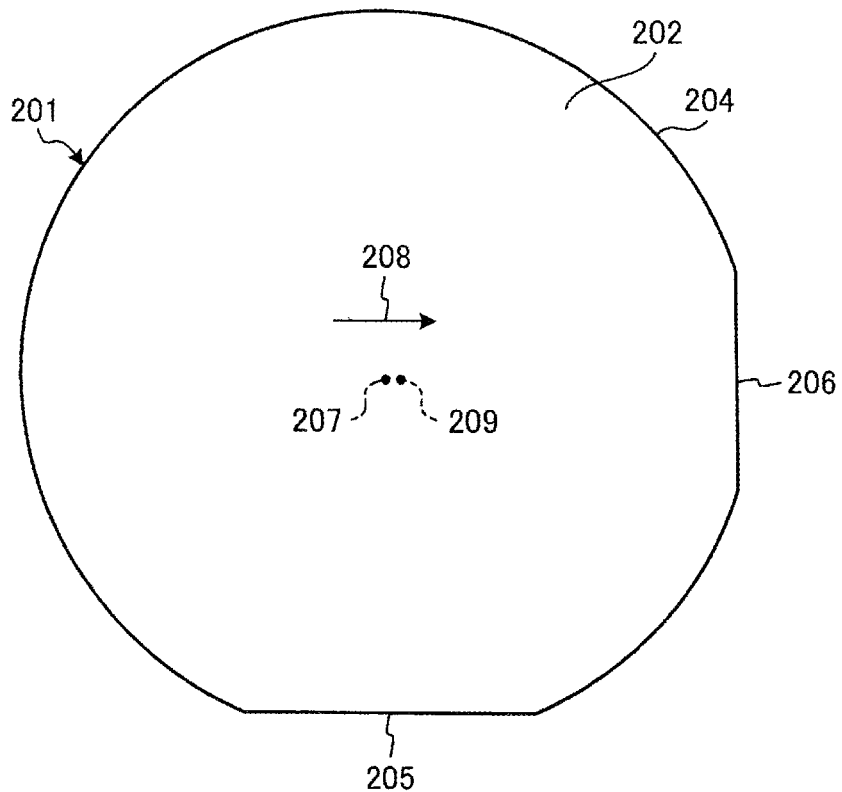
FIG. 4 is a plan view of an SiC ingot from which the wafer illustrated in FIG. 2 is separated.
Figure 5:
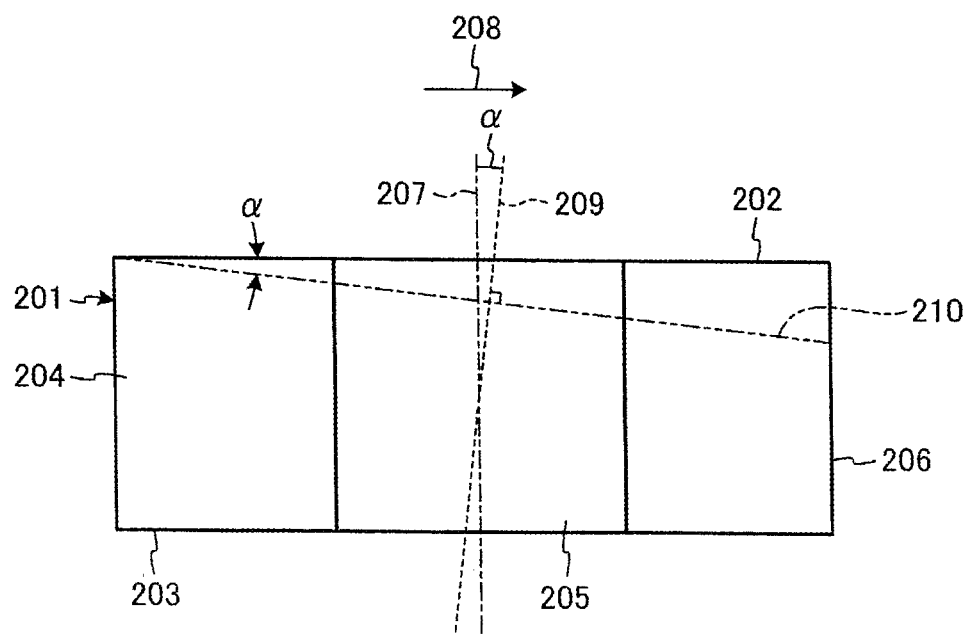
FIG. 5 is a side view of the SiC ingot illustrated in FIG. 4.
Figure 6:
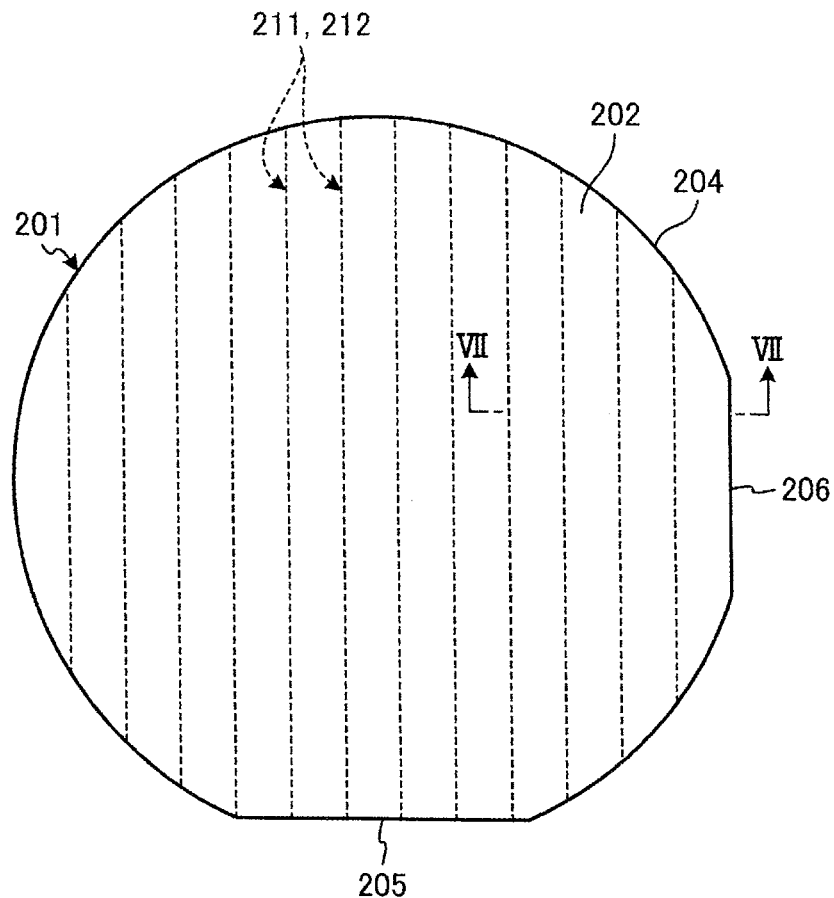
FIG. 6 is a plan view of the state in which separation layers are formed in the SiC ingot illustrated in FIG. 4.
Figure 7:
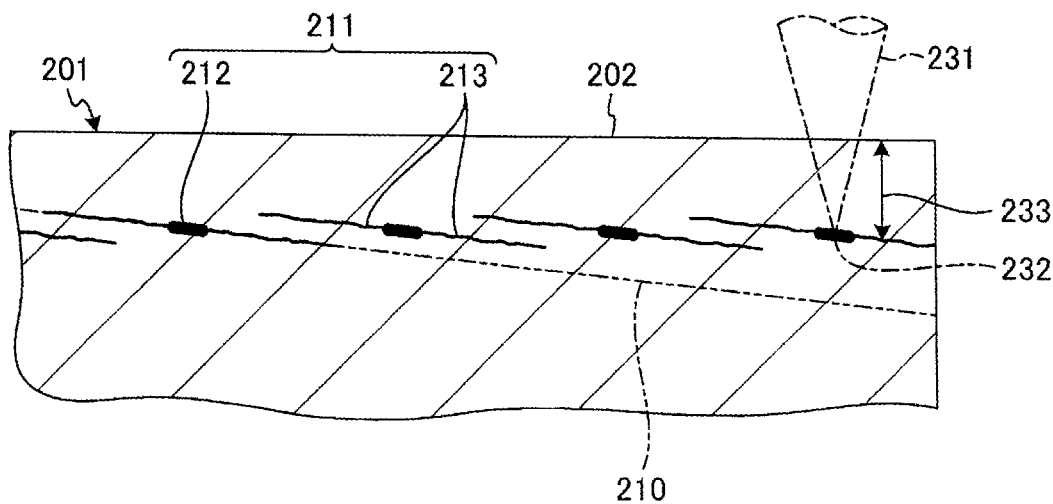
FIG. 7 is a sectional view taken along line VII-VII in FIG. 6.

A grinding apparatus according to a first embodiment of the present invention will be described on the basis of the drawings. FIG. 1 is a perspective view illustrating a configuration example of a grinding apparatus according to the first embodiment. FIG. 2 is a perspective view of a wafer that is a processing target of the grinding apparatus according to the first embodiment. FIG. 3 is a plan view of the wafer illustrated in FIG. 2 as viewed from the lower side. FIG. 4 is a plan view of an SiC ingot from which the wafer illustrated in FIG. 2 is separated. FIG. 5 is a side view of the SiC ingot illustrated in FIG. 4. FIG. 6 is a plan view of the state in which separation layers are formed in the SiC ingot illustrated in FIG. 4. FIG. 7 is a sectional view taken along line VII-VII in FIG. 6.

(Wafer)

A grinding apparatus 1 according to the first embodiment illustrated in FIG. 1 is a processing apparatus that grinds the wafer illustrated in FIG. 2 and FIG. 3. A wafer 200 that is a processing target of the grinding apparatus 1 illustrated in FIG. 1 and that is illustrated in FIG. 2 and FIG. 3 is generated by being separated from an SiC ingot 201 (equivalent to the ingot) illustrated in FIG. 4 and FIG. 5. In the first embodiment, the SiC ingot 201 illustrated in FIG. 4 and FIG. 5 is composed of silicon carbide (SiC) and is formed into a circular column shape as a whole. In the first embodiment, the SiC ingot 201 is a hexagonal single-crystal SiC ingot.

As illustrated in FIG. 4 and FIG. 5, the SiC ingot 201 has a circular flat surface 202, a circular second surface 203 on the back surface side of the flat surface 202, and a circumferential surface 204 continuous with the outer edge of the flat surface 202 and the outer edge of the second surface 203. Further, the SiC ingot 201 has, in the circumferential surface 204, a first orientation flat 205 that indicates the crystal orientation and a second orientation flat 206 orthogonal to the first orientation flat 205. The length of the first orientation flat 205 is longer than that of the second orientation flat 206.

Further, the SiC ingot 201 has a c-axis 209 inclined with respect to a perpendicular line 207 to the flat surface 202 by an off-angle α in an inclination direction 208 toward the second orientation flat 206 and a c-plane 210 orthogonal to the c-axis 209. The c-plane 210 is inclined with respect to the flat surface 202 of the SiC ingot 201 by the off-angle α. The inclination direction 208 of the c-axis 209 from the perpendicular line 207 is orthogonal to the extension direction of the second orientation flat 206 and is parallel to the first orientation flat 205. As the c-plane 210, an infinite number of planes are set in the SiC ingot 201. In the first embodiment, the off-angle α is set to 1°, 4°, or 6°. However, in the present invention, the SiC ingot 201 can be manufactured with the off-angle α freely set in a range of 1° to 6°, for example.

Grinding processing of the surface on the side opposite to the second surface 203 of the SiC ingot 201 is executed by the grinding apparatus, and thereafter polishing processing is executed by a polishing apparatus. As a result, the flat surface 202 with a mirror surface shape is formed.

Separation layers 211 illustrated in FIG. 6 and FIG. 7 are formed in the SiC ingot 201 illustrated in FIG. 4 and FIG. 5, and thereafter the wafer 200 is separated with use of the separation layers 211 as the starting point. A focal point 232 (illustrated in FIG. 7) of a pulsed laser beam 231 (illustrated in FIG. 7) with a wavelength having transmissibility with respect to the SiC ingot 201 is positioned to a position at a desired depth 233 (illustrated in FIG. 7) corresponding to the thickness of the wafer 200 to be generated from the flat surface 202 of the SiC ingot 201, and irradiation with the pulsed laser beam 231 is executed along the second orientation flat 206. As a result, the separation layers 211 are formed inside the SiC ingot 201.

When the irradiation with the pulsed laser beam 231 with the wavelength having transmissibility with respect to the SiC ingot 201 is executed, as illustrated in FIG. 7, a modified part 212 arising from separation of SiC into silicon (Si) and carbon (C) due to the irradiation with the pulsed laser beam 231 and absorption of the pulsed laser beam 231 with which irradiation is executed next, by previously-formed C, and separation of SiC into Si and C in a chain-reaction manner is formed inside the SiC ingot 201 along the extension direction of the second orientation flat 206. In addition, cracks 213 that extend from the modified part 212 along the c-plane 210 are generated. In this manner, when the irradiation with the pulsed laser beam 231 with the wavelength having transmissibility with respect to the SiC ingot 201 is executed, the separation layer 211 including the modified part 212 and the cracks 213 formed from the modified part 212 along the c-plane 210 is formed in the SiC ingot 201.

When the SiC ingot 201 is irradiated with the laser beam 231 over the whole length in the direction parallel to the second orientation flat 206, indexing feed of the SiC ingot 201 is executed along the first orientation flat 205 relative to an unillustrated laser beam irradiation unit that executes the irradiation with the laser beam 231. Again, the focal point 232 is positioned to a position at the desired depth 233 from the flat surface 202, the SiC ingot 201 is irradiated with the pulsed laser beam 231 along the second orientation flat 206, and the separation layer 211 is formed inside. In this manner, operation of the irradiation with the laser beam 231 along the second orientation flat 206 and operation of the relative indexing feed of the laser beam irradiation unit along the first orientation flat 205 are repeated.

As a result, in the SiC ingot 201, at every movement distance of the indexing feed, the separation layer 211 that includes the modified part 212 arising from separation of SiC into Si and C and the cracks 213 and at which the strength is lowered relative to the other part is formed at the position at the desired depth 233 corresponding to the thickness of the wafer 200 from the flat surface 202. In the SiC ingot 201, the separation layer 211 is formed at every movement distance of the indexing feed over the whole length in the direction parallel to the first orientation flat 205 at the position at the desired depth 233 from the flat surface 202. After the separation layers 211 are formed across the whole of the SiC ingot 201, the side of the flat surface 202 is separated with use of the separation layers 211 as the starting point, so that the wafer 200 illustrated in FIG. 2 and FIG. 3 is generated.

Thus, the wafer 200 has recesses and projections 215 that are formed due to the above-described modified parts 212 and cracks 213 and have surface roughness of approximately several tens of micrometers as illustrated in FIG. 3 in a separation surface 214 on the side of the separation layers 211 at which the wafer 200 is separated from the SiC ingot 201, i.e., on the side of the second surface 203. For the wafer 200 illustrated in FIG. 2 and FIG. 3, grinding processing is executed for the separation surface 214 separated from the SiC ingot 201, by the grinding apparatus 1 illustrated in FIG. 1, and polishing processing and so forth are executed by a polishing apparatus that is not illustrated in the diagram. Devices are formed on a front surface of the wafer 200 after the grinding processing, the polishing processing, and so forth are executed for the separation surface 214. In the first embodiment, the device is a metal-oxide-semiconductor field-effect transistor (MOSFET), micro electro mechanical systems (MEMS), or a Schottky barrier diode (SBD). However, in the present invention, the device is not limited to the MOSFET, the MEMS, and the SBD. The same part as the SiC ingot 201 of the wafer 200 is given the same numeral, and description thereof is omitted.

(Grinding Apparatus)

Next, the grinding apparatus will be described. The grinding apparatus 1 is a processing apparatus that grinds the separation surface 214 having the recesses and projections 215 in the wafer 200 generated through separation from the SiC ingot 201 and thins the wafer 200 to a predetermined finished thickness. As illustrated in FIG. 1, the grinding apparatus 1 includes an apparatus main body 2, a rough grinding unit 3 (equivalent to the grinding unit), a finish grinding unit 4 (equivalent to the grinding unit), grinding feed units 5, a turntable 6, a plurality of (in the first embodiment, three) holding tables 7 set on the turntable 6, cassettes 8 and 9, a position adjustment unit 10, a conveying unit 11, a cleaning unit 12, and a control unit 100.

The turntable 6 is a table that is disposed on the upper surface of the apparatus main body 2 and has a circular disc shape. The turntable 6 is disposed rotatably around the axial center parallel to a Z-axis direction in a horizontal plane and is rotationally driven at a predetermined timing. On the turntable 6, for example, three holding tables 7 are disposed at equal intervals with a phase angle of 120 degrees, for example. The three holding tables 7 have a holding table structure in which a holding surface 71 includes a vacuum chuck connected to a suction source 73 through a suction path 72. The wafer 200 is placed on the holding surface 71 and is sucked by the suction source 73 through the suction path 72, and the holding table 7 thereby holds under suction the wafer 200 by the holding surface 71.

Pressure gauges 74 are disposed on the suction paths 72. The pressure gauges 74 measure the pressure in the suction path 72, for example, a pressure generated due to suction of the wafer 200 on the holding surface 71 by the suction source 73 (in the first embodiment, negative pressure lower than the atmospheric pressure). The pressure gauges 74 output the measurement result to the control unit 100.

At the time of grinding, the holding tables 7 are rotationally driven in a horizontal plane by a rotational drive mechanism around the axial center parallel to the vertical direction, i.e., the Z-axis direction. As described above, the holding tables 7 are configured to have the holding surface 71 that holds the wafer 200 and be rotatable around the axial center. The holding tables 7 are sequentially moved to a carrying-in/out region 301, a rough grinding region 302, a finish grinding region 303, and the carrying-in/out region 301 by rotation of the turntable 6.

The carrying-in/out region 301 is a region in which the wafer 200 is carried in and carried out to and from the holding table 7. The rough grinding region 302 is a region in which rough grinding (equivalent to the grinding) of the wafer 200 held by the holding table 7 is executed by the rough grinding unit 3. The finish grinding region 303 is a region in which finish grinding (equivalent to the grinding) of the wafer 200 held by the holding table 7 is executed by the finish grinding unit 4.

The rough grinding unit 3 is a grinding unit on which a grinding wheel 32 for rough grinding in which grinding abrasive stones 31 for rough grinding to execute the rough grinding of an upper surface 216 (illustrated in FIG. 9 and FIG. 10; one of the flat surface 202 and the separation surface 214) that is a surface exposed upward in the wafer 200 held by the holding table 7 are annularly disposed is mounted, and that executes the rough grinding of the upper surface 216 of the wafer 200 held by the holding surface 71 of the holding table 7 in the rough grinding region 302. The finish grinding unit 4 is a grinding unit on which a grinding wheel 42 for finish grinding in which grinding abrasive stones 41 for finish grinding to execute the finish grinding of the upper surface 216 of the wafer 200 held by the holding table 7 are annularly disposed is mounted, and that executes the finish grinding of the upper surface 216 of the wafer 200 held by the holding surface 71 of the holding table 7 in the finish grinding region 303.

Thus, the rough grinding unit 3 is a grinding unit that uses the grinding wheel 32 for rough grinding, and the finish grinding unit 4 is a grinding unit that executes, by using the grinding wheel 42, the finish grinding of the wafer 200 for which the rough grinding has been executed by the rough grinding unit 3. The grinding units 3 and 4 have substantially the same configuration, and hence, description will hereinafter be made with the same part given the same numeral.

As illustrated in FIG. 1, the rough grinding unit 3 and the finish grinding unit 4 have an unillustrated spindle that has a lower end on which the grinding wheel 32 or 42 is mounted and a motor 34 that rotationally drives the spindle around the axial center parallel to the Z-axis direction. The grinding wheels 32 and 42 have an annular base 35 with a circular annular shape and the plurality of grinding abrasive stones 31 or 41 fixed to the lower surface of the annular base 35. The grinding abrasive stones 31 and 41 are arranged in the circumferential direction at the outer edge part of the lower surface of the annular base 35. The grinding abrasive stones 31 and 41 are configured through fixing of abrasive grains by a bond. The abrasive grains of the grinding abrasive stones 31 of the grinding wheel 32 have a coarser grain size (that is, are larger) than the abrasive grains of the grinding abrasive stones 41 of the grinding wheel 42, and the abrasive grains of the grinding abrasive stones 41 of the grinding wheel 42 have a finer grain size than the abrasive grains of the grinding abrasive stones 31 of the grinding wheel 32.

The spindle is housed in a spindle housing 36 rotatably around the axial center parallel to the Z-axis direction perpendicular to the holding surface 71 and is rotated around the axial center by the motor 34 attached to the spindle housing 36. The spindle is formed into a circular column shape and has a lower end on which a wheel mount 37 for mounting the grinding wheel 32 or 42 is disposed. The wheel mount 37 protrudes from the lower end of the spindle in the direction toward the outer circumference across the whole circumference and the planar shape of the outer circumferential surface thereof is formed into a circular shape. The upper surface of the annular base 35 is made to overlap the lower surface of the wheel mount 37, and the grinding wheel 32 or 42 is fixed by unillustrated bolts. The spindle and the wheel mount 37 are disposed at such positions as to be coaxial with each other.

The spindle and the grinding wheel 32 or 42 are rotated around the axial center by the motor 34. In addition, the grinding abrasive stones 31 or 41 are brought close to the holding table 7 at a predetermined feed rate by the grinding feed unit 5 while grinding water is supplied to the upper surface 216 of the wafer 200 held by the holding table 7 in the grinding region 302 or 303. As a result, the grinding unit 3 or 4 executes the rough grinding or the finish grinding of the upper surface 216 of the wafer 200.

The grinding feed unit 5 moves the grinding unit 3 or 4 in the Z-axis direction and causes the grinding unit 3 or 4 to get away from or get closer to the holding table 7. In the first embodiment, the grinding feed unit 5 is disposed on an upright column 21 set upright from one end part of the apparatus main body 2 in a Y-axis direction parallel to the horizontal direction. The grinding feed unit 5 includes a well-known ball screw disposed rotatably around the axial center, a well-known motor that rotates the ball screw around the axial center, and a well-known guide rail that supports the spindle housing 36 of each grinding unit 3 or 4 movably in the Z-axis direction.

In the first embodiment, for the rough grinding unit 3 and the finish grinding unit 4, the axial center that is the rotation center of the grinding wheel 32 or 42 and the axial center that is the rotation center of the holding table 7 are disposed substantially in parallel with an interval between each other in the horizontal direction, and the grinding abrasive stones 31 or 41 pass over the center of the upper surface 216 of the wafer 200 held by the holding table 7.

The cassettes 8 and 9 are housing containers having a plurality of slots and can house a plurality of wafers 200. The cassettes 8 and 9 house a plurality of wafers 200 that have not yet undergone or that have undergone grinding processing, for example. The cassettes 8 and 9 are set on cassette setting pedestals 13. That is, the grinding apparatus 1 includes the cassette setting pedestals 13 on which the cassettes 8 and 9 are set. The cassette setting pedestals 13 raise and lower the cassettes 8 and 9 in the Z-axis direction. The position adjustment unit 10 is a table for temporary placement of the wafer 200 taken out from the cassette 8 or 9 and execution of adjustment of the center position of the wafer 200.

The conveying unit 11 includes one or more conveying arms 14 that convey the wafer 200 from the cassette 8 or 9 to the holding table 7. In the first embodiment, the conveying unit 11 includes three conveying arms 14. Two out of the three conveying arms 14 have a suction adhesion pad that causes suction adhesion of the wafer 200. One conveying arm 14 (hereinafter, denoted by numeral 14-1) of the two holds, by suction adhesion, the wafer 200 that has not yet undergone grinding processing and for which position adjustment has been executed by the position adjustment unit 10 and carries in the wafer 200 onto the holding table 7 located in the carrying-in/out region 301. The other conveying arm 14 (hereinafter, denoted by numeral 14-2) holds, by suction adhesion, the wafer 200 that has undergone grinding processing and that is held on the holding table 7 located in the carrying-in/out region 301 and carries out the wafer 200 to the cleaning unit 12.

Figure 8:
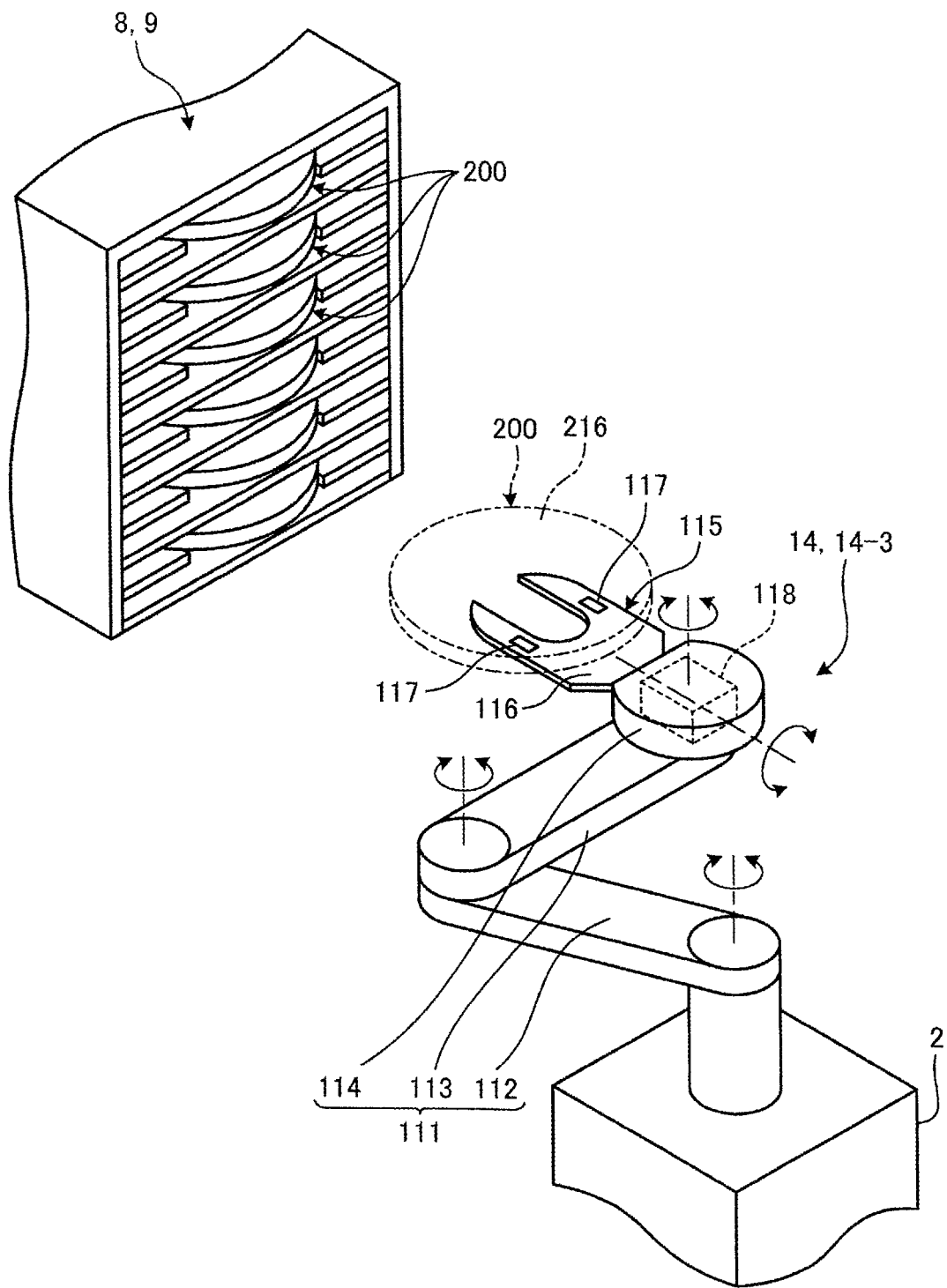
FIG. 8 is a perspective view illustrating a configuration example of a conveying arm of the grinding apparatus illustrated in FIG. 1.

The remaining one conveying arm 14 (hereinafter, denoted by numeral 14-3) takes out the wafer 200 that has not yet undergone grinding processing from the cassette 8 or 9 to carry out the wafer 200 to the position adjustment unit 10, and takes out the wafer 200 that has undergone grinding processing from the cleaning unit 12 to carry in the wafer 200 to the cassette 8 or 9. FIG. 8 is a perspective view illustrating a configuration example of the conveying arm of the grinding apparatus illustrated in FIG. 1. As illustrated in FIG. 8, the conveying arm 14-3 includes an arm part 111, a U-shaped hand 115 connected to the arm part 111, an arm drive part, and a drive part 118.

The arm part 111 includes a first arm 112 having one end part coupled to the apparatus main body 2 rotatably around the axial center parallel to the Z-axis direction, a second arm 113 having one end part coupled to the other end part of the first arm 112 rotatably around the axial center parallel to the Z-axis direction, and a rotating component 114 coupled to the other end part of the second arm 113 rotatably around the axial center parallel to the Z-axis direction.

The U-shaped hand 115 has suction holes 117 connected to an unillustrated suction source in a surface 116 and holds under suction the wafer 200 by the surface 116 through suction of the suction holes 117 by the suction source. The surface 116 is a holding surface that holds the wafer 200. The U-shaped hand 115 is coupled to the rotating component 114 rotatably around the axial center parallel to the horizontal direction. Therefore, the arm part 111 is connected to the surface 116 of the U-shaped hand 115, which is the holding surface.

The arm drive part positions the U-shaped hand 115 to an arbitrary position by rotating the arms 112 and 113 and the rotating component 114 around the axial centers parallel to the Z-axis direction. The drive part 118 is set in the rotating component 114 of the arm part 111 and rotates the U-shaped hand 115 around the axial center parallel to the horizontal direction. The drive part 118 can rotate the surface 116, which is the holding surface, by 180 degrees by rotating the surface 116, which is the holding surface, around the above-described axial center and execute switching between the state in which the surface 116, which is the holding surface, is oriented upward and the state in which the surface 116 is oriented downward, i.e., invert the upward-downward orientation of the surface 116, which is the holding surface.

The cleaning unit 12 cleans the wafer 200 that has undergone grinding and removes contamination such as grinding dust that adheres to the upper surface 216 ground.

Further, the grinding apparatus 1 includes thickness measuring instruments 15 that measure the thickness of the wafer 200 held by the holding table 7 in the rough grinding region 302 and the finish grinding region 303. The thickness measuring instruments 15 are thickness measuring instruments of what is generally called a contact type including a contact 151 that comes into contact with the upper surface 216 of the wafer 200 held by the holding table 7, a contact 152 that comes into contact with the holding surface 71 of the holding table 7, and a measuring mechanism that measures the difference in the height between the contacts 151 and 152 and measures the thickness of the wafer. In the first embodiment, the measuring mechanism outputs the measurement result to the control unit 100.

Further, the grinding apparatus 1 includes upper surface height measuring instruments 15-1. In the first embodiment, the upper surface height measuring instruments 15-1 measure the height of the upper surface 216 of the wafer 200 with use of the contact 151 that configures the thickness measuring instrument 15 and comes into contact with the upper surface 216 of the wafer 200, and output the height to the control unit 100. Moreover, in the first embodiment, the upper surface height measuring instrument 15-1 includes a height measuring mechanism 153 that measures the height of the upper surface 216 (equivalent to the upper surface height) of the wafer 200 with which the contact 151 comes into contact. The height measuring mechanism 153 of the upper surface height measuring instrument 15-1 measures the height of the upper surface 216 at a plurality of places in the state in which the holding table 7 is rotating around the axial center, and measures the largest difference between the measured lowest height of the upper surface 216 of the wafer 200 and the measured highest height of the upper surface 216 of the wafer 200 (equivalent to the difference in the upper surface height) to output the measurement result to the control unit 100.

In the first embodiment, the upper surface height measuring instrument 15-1 set in the rough grinding region 302 is a detecting unit that allows determination as to whether the upper surface 216 of the wafer 200 held by the holding table 7 is the flat surface 202 or the separation surface 214 by measuring the above-described difference in the upper surface height and outputting the difference to the control unit 100. In other words, the upper surface height measuring instrument 15-1 is a detecting unit that detects a physical quantity, i.e., the upper surface height (difference in the upper surface height), used for determination of the state of exposure of the separation surface 214.

In the first embodiment, the measuring mechanism of the thickness measuring instrument 15 and the height measuring mechanism 153 include a dedicated processing circuit (hardware) such as a single circuit, a composite circuit, a programmed processor, or a parallel-programmed processor.

The control unit 100 controls each of the above-described respective constituent units that configure the grinding apparatus 1. That is, the control unit 100 causes the grinding apparatus 1 to execute processing operation on the wafer 200. The control unit 100 is a computer having a calculation processing device having a microprocessor such as a central processing unit (CPU), a storing device having a memory such as a read only memory (ROM) or a random access memory (RAM), and an input-output interface device.

The calculation processing device of the control unit 100 executes calculation processing in accordance with a computer program stored in the storing device and outputs a control signal for controlling the grinding apparatus 1 to the above-described constituent elements of the grinding apparatus 1 through the input-output interface device. Further, the control unit 100 is connected to a display unit 101 including a liquid crystal display device or the like that displays the state of processing operation, an image, and so forth, an input unit 102 used when an operator registers information regarding the contents of processing or the like, and an informing unit 103 that executes informing the operator of a determination or the like. The input unit 102 includes at least one of a touch panel disposed on the display unit 101, a keyboard, and so forth. The informing unit 103 issues at least any of sound, light, and a message on the touch panel to execute informing the operator of a determination or the like.

Moreover, the control unit 100 of the grinding apparatus 1 according to the first embodiment includes an exposure determining unit 104. In the first embodiment, the exposure determining unit 104 determines whether the upper surface 216 of the wafer 200 held by the holding table 7 is the flat surface 202 or the separation surface 214 on the basis of the measurement result of the height measuring mechanism 153 of the upper surface height measuring instrument 15-1 set in the rough grinding region 302, which is the detecting unit. That is, the exposure determining unit 104 determines the state of exposure of the separation surface 214 on the basis of a physical quantity, i.e., the upper surface height (difference in the upper surface height) detected by the detecting unit.

When the side of the separation surface 214 of the wafer 200 is held by the holding surface 71 of the holding table 7, the flat surface 202 becomes the upper surface 216 and is exposed, so that the difference in the upper surface height becomes sufficiently small. Thus, in the first embodiment, the exposure determining unit 104 determines whether or not the difference in the upper surface height that is the measurement result of the height measuring mechanism 153 of the upper surface height measuring instrument 15-1 is less than a threshold defined in advance. It is desirable for the threshold to be a value smaller than the difference in the upper surface height when the upper surface 216 of the wafer 200 is the separation surface 214.

In the first embodiment, when the difference in the upper surface height is less than the threshold, the exposure determining unit 104 determines that the state of exposure is an abnormal state in which the upper surface 216 of the wafer 200 held by the holding table 7 is the flat surface 202, that is, the separation surface 214 is not exposed upward. When the difference in the upper surface height is not less than (that is, is equal to or larger than) the threshold, the exposure determining unit 104 determines that the state of exposure is a normal state in which the upper surface 216 of the wafer 200 held by the holding table 7 is the separation surface 214, that is, the separation surface 214 is exposed upward.

When the exposure determining unit 104 determines that the state of exposure is the normal state, the control unit 100 continues the processing operation of the grinding apparatus 1. In the first embodiment, when the exposure determining unit 104 determines that the state of exposure is the abnormal state, the control unit 100 suspends the processing operation of the grinding apparatus 1 and causes the informing unit 103 to operate to execute informing the operator of the determination or the like. In this manner, in the first embodiment, when it is determined that the state of exposure is the abnormal state on the basis of the measurement result of the upper surface height measuring instrument 15-1 set in the rough grinding region 302, the control unit 100 causes the informing unit 103 to operate to execute informing the operator of the determination or the like.

In the first embodiment, when the exposure determining unit 104 determines that the state of exposure is the abnormal state, the control unit 100 suspends the processing operation of the grinding apparatus 1 and causes the informing unit 103 to operate to execute informing the operator of the determination or the like. Thereafter, in the first embodiment, the orientation of the wafer 200 on the holding table 7 is changed by the operator in such a manner that the separation surface 214 is exposed upward. Then, the control unit 100 resumes the processing operation upon accepting an instruction to resume the processing from the operator through the input unit 102. Further, when the exposure determining unit 104 determines that the state of exposure is the abnormal state, the control unit 100 may control constituent elements of the grinding apparatus 1 to house the wafer 200 on the holding table 7 in the cassette 8 or 9 without executing grinding processing and execute informing the operator of the determination or the like through displaying a log indicating that the wafer 200 has not been processed on the display unit 101, or the like. Functions of the exposure determining unit 104 are implemented through execution of a computer program stored in the storing device by the calculation processing device of the control unit 100.

(Processing Operation)

Figure 9:
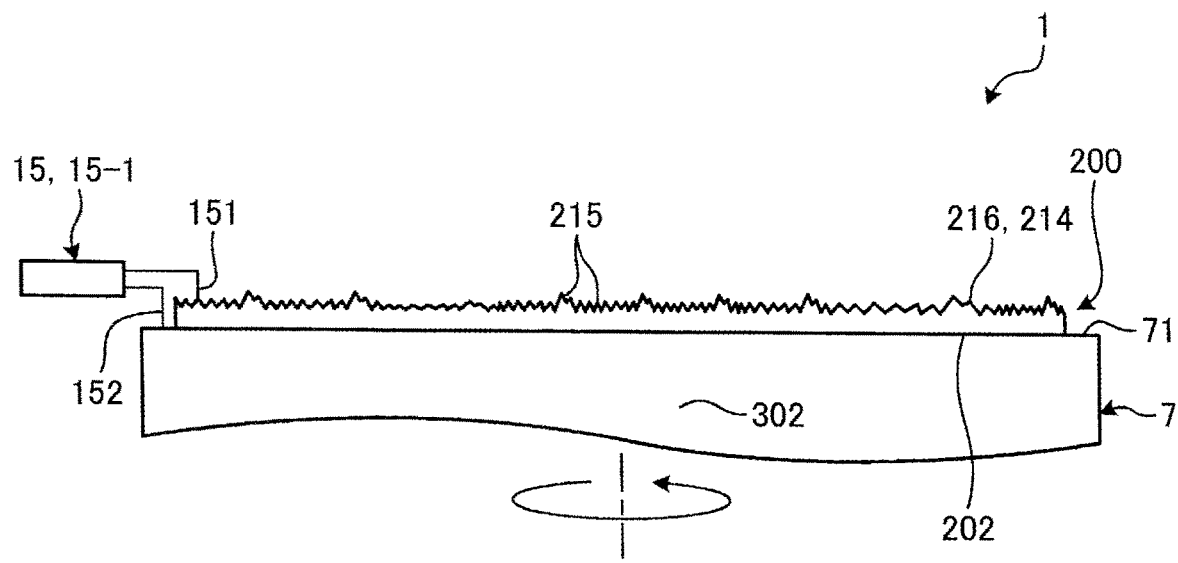
FIG. 9 is a side view schematically illustrating the state in which the upper surface of the wafer held by a holding table of the grinding apparatus illustrated in FIG. 1 is a separation surface.
Figure 10:
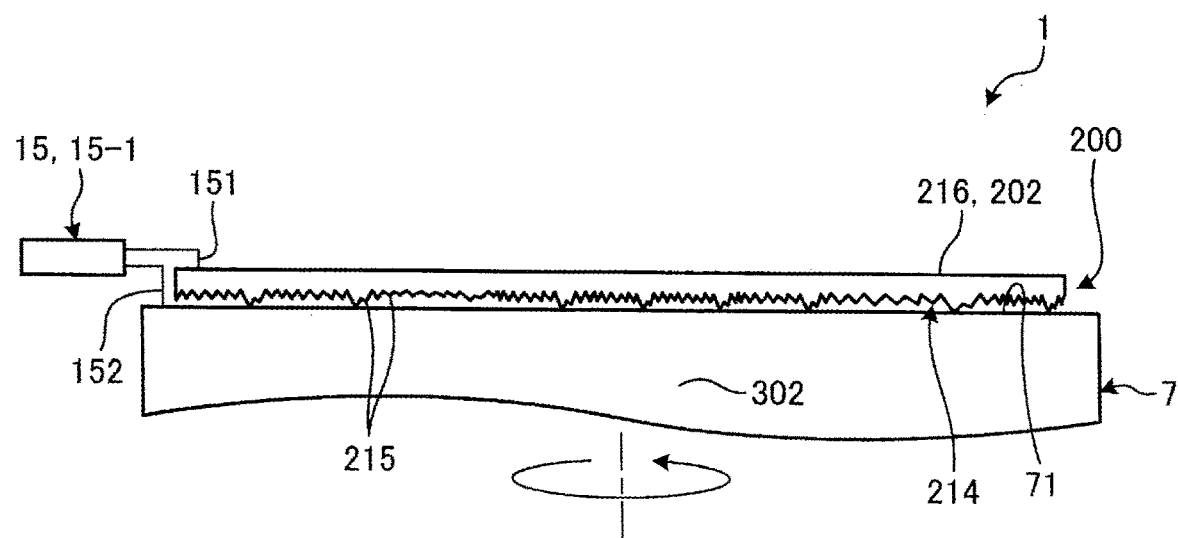
FIG. 10 is a side view schematically illustrating the state in which the upper surface of the wafer held by the holding table of the grinding apparatus illustrated in FIG. 1 is a flat surface.

Next, processing operation of the grinding apparatus 1 will be described. FIG. 9 is a side view schematically illustrating the state in which the upper surface of the wafer held by the holding table of the grinding apparatus illustrated in FIG. 1 is the separation surface. FIG. 10 is a side view schematically illustrating the state in which the upper surface of the wafer held by the holding table of the grinding apparatus illustrated in FIG. 1 is the flat surface.

The grinding apparatus 1 with the above-described configuration executes processing operation in which rough grinding processing and finish grinding processing are sequentially executed for the wafer 200 to thin the wafer 200 through control of the respective constituent units by the control unit 100. In the first embodiment, the grinding apparatus 1 starts the processing operation when the cassettes 8 and 9 in which the wafers 200 are housed with the flat surface 202 of the wafer 200 oriented downward and the separation surface 214 oriented upward are set on the apparatus main body 2 by an operator, processing conditions are registered in the control unit 100, and the control unit 100 accepts an instruction to start the processing operation from the operator.

In the processing operation, the grinding apparatus 1 rotates the spindles of the respective grinding units 3 and 4 around the axial centers at a rotation speed defined in the processing conditions and causes the conveying arm 14-3 to take out one wafer 200 from the cassette 8 and carry out the wafer 200 to the position adjustment unit 10. The grinding apparatus 1 causes the position adjustment unit 10 to execute adjustment of the center position of the wafer 200 and causes the conveying arm 14-1 to carry in the wafer 200 for which the position adjustment has been executed, onto the holding table 7 located in the carrying-in/out region 301. At this time, the wafer 200 carried in to the holding table 7 is positioned to such a position as to be coaxial with the holding table 7.

In the processing operation, the grinding apparatus 1 holds under suction the wafer 200 on the holding table 7 in the carrying-in/out region 301 and rotates the turntable 6 to move the holding table 7 that has held the wafer 200 in the carrying-in/out region 301 to the rough grinding region 302. In the processing operation, the grinding apparatus 1 rotates the holding table 7 around the axial center at a predetermined rotation speed in the state in which the contact 151 of the upper surface height measuring instrument 15-1 set in the rough grinding region 302 is brought into contact with the upper surface 216 of the wafer 200 and the other contact 152 is brought into contact with the holding surface 71 of the holding table 7.

The grinding apparatus 1 rotates the holding table 7 around the axial center at a predetermined rotation speed, and the height measuring mechanism 153 of the upper surface height measuring instrument 15-1 measures the height of the upper surface 216 at a plurality of places in the wafer 200 and measures the difference in the upper surface height of the upper surface 216 of the wafer 200 to output the measurement result to the control unit 100. The exposure determining unit 104 of the control unit 100 determines whether or not the difference in the upper surface height measured by the height measuring mechanism 153 of the upper surface height measuring instrument 15-1 is less than the threshold defined in advance. At this time, as illustrated in FIG. 9, when the difference in the upper surface height of the wafer 200 is not less than the threshold, the exposure determining unit 104 determines that the upper surface 216 is the separation surface 214. Furthermore, as illustrated in FIG. 10, when the difference in the upper surface height of the wafer 200 is less than the threshold, the exposure determining unit 104 determines that the upper surface 216 is the flat surface 202.

In the grinding apparatus 1, when determining that the difference in the upper surface height that is the measurement result of the height measuring mechanism 153 of the upper surface height measuring instrument 15-1 is less than the threshold, the exposure determining unit 104 of the control unit 100 determines that the state of exposure is the abnormal state in which the separation surface 214 of the wafer 200 held by the holding table 7 is not exposed upward. Then, the control unit 100 suspends the processing operation of the grinding apparatus 1 and causes the informing unit 103 to operate to execute informing the operator of the determination or the like.

In the grinding apparatus 1, when determining that the difference in the upper surface height that is the measurement result of the height measuring mechanism 153 of the upper surface height measuring instrument 15-1 is not less than (that is, is equal to or larger than) the threshold, the exposure determining unit 104 of the control unit 100 determines that the state of exposure is the normal state in which the separation surface 214 of the wafer 200 held by the holding table 7 is exposed upward, and the control unit 100 continues the processing operation of the grinding apparatus 1.

In the processing operation, the grinding apparatus 1 rotates the holding table 7 around the axial center and executes the rough grinding processing of the wafer 200 by the rough grinding unit 3 while supplying the grinding water. Then, the grinding apparatus 1 rotates the turntable 6 to move the holding table 7 that holds the wafer 200 that has undergone the rough grinding processing to the finish grinding region 303. The grinding apparatus 1 rotates the holding table 7 around the axial center and executes the finish grinding processing of the wafer 200 by the finish grinding unit 4 while supplying the grinding water. Then, the grinding apparatus 1 rotates the turntable 6 to move, to the carrying-in/out region 301, the holding table 7 in which the rotation around the axial center has stopped and that holds the wafer 200 that has undergone the finish grinding processing.

In the processing operation, the grinding apparatus 1 conveys the wafer 200 that has undergone the finish grinding processing from the holding table 7 in the carrying-in/out region 301 to the cleaning unit 12, cleans the wafer 200 by the cleaning unit 12, and thereafter houses the wafer 200 in the cassette 8 or 9. In the processing operation, every time the turntable 6 rotates, the grinding apparatus 1 conveys the wafer 200 to the cleaning unit 12 from the holding table 7 that holds the wafer 200 that has undergone the finish grinding processing in the carrying-in/out region 301 and then carries in the wafer 200 that has not yet undergone grinding processing to the holding table 7 that does not hold the wafer 200 that has undergone the finish grinding processing in the carrying-in/out region 301. The grinding apparatus 1 ends the processing operation when having executed the rough grinding processing and the finish grinding processing for all the wafers 200 in the cassettes 8 and 9.

As described above, the grinding apparatus 1 according to the first embodiment includes the upper surface height measuring instrument 15-1 that is the detecting unit that detects a physical quantity, i.e., the upper surface height (difference in the upper surface height), used for determination of the state of exposure of the separation surface 214. Thus, it is possible to determine whether the upper surface 216 of the wafer 200 held by the holding table 7 is the separation surface 214 or the flat surface 202. As a result, the grinding apparatus 1 provides an effect of decreasing the possibility that the separation surface 214 is held on the holding table 7 and the flat surface 202 that is the surface opposite to the separation surface 214 of the wafer 200 is ground.

Further, in the grinding apparatus 1 according to the first embodiment, the upper surface height measuring instrument 15-1 measures the difference in the upper surface height at a plurality of places on the upper surface 216 of the wafer 200, and it is determined whether or not the measured difference in the upper surface height is less than the threshold defined in advance. When it is determined that the difference in the upper surface height is less than the threshold, it is determined that the state of exposure is the abnormal state in which the separation surface 214 is not exposed upward. As described above, the grinding apparatus 1 determines whether the upper surface 216 of the wafer 200 held by the holding table 7 is the separation surface 214 or the flat surface 202 by using the upper surface height measuring instrument 15-1 that measures the difference in the upper surface height at a plurality of places on the upper surface 216 of the wafer 200. Thus, an abnormality can be detected without increasing the number of parts.

Moreover, when determining that the state of exposure is the abnormal state in which the separation surface 214 is not exposed upward, the grinding apparatus 1 according to the first embodiment executes informing the operator of the determination or the like. Thus, an appropriate response can be made.

In the present invention, in the grinding apparatus 1 according to the first embodiment, the upper surface height measuring instrument 15-1 may be set in the carrying-in/out region 301, the difference in the upper surface height of the wafer 200 placed on the holding table 7 positioned in the carrying-in/out region 301 may be measured, and a physical quantity, i.e., the upper surface height (difference in the upper surface height), used for determination of the state of exposure of the separation surface 214 may be detected as in the first embodiment.

Second Embodiment

Figure 11:
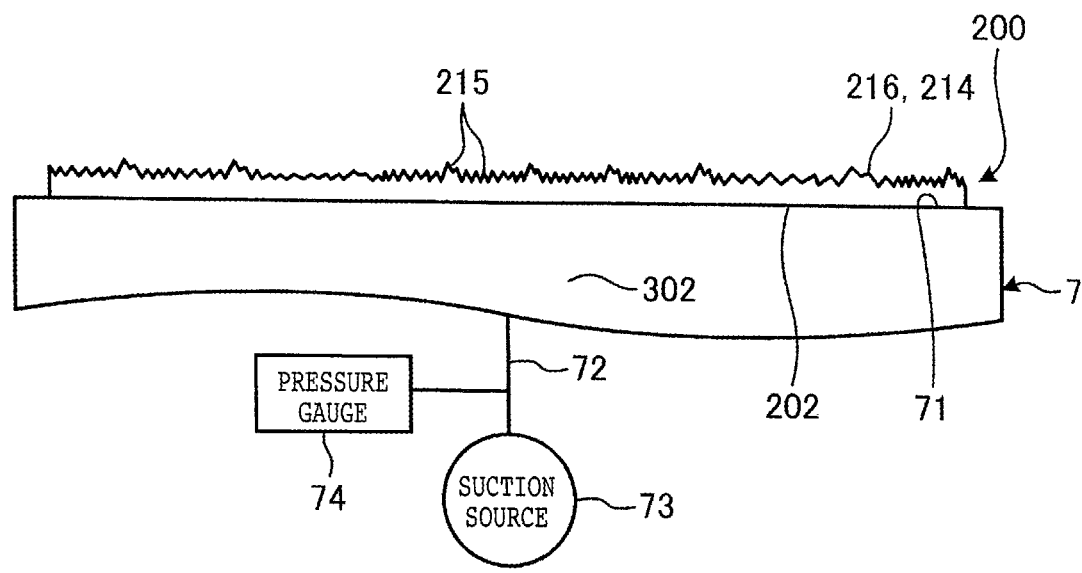
FIG. 11 is a side view schematically illustrating the state in which the upper surface of the wafer held by the holding table of a grinding apparatus according to a second embodiment is the separation surface.
Figure 12:
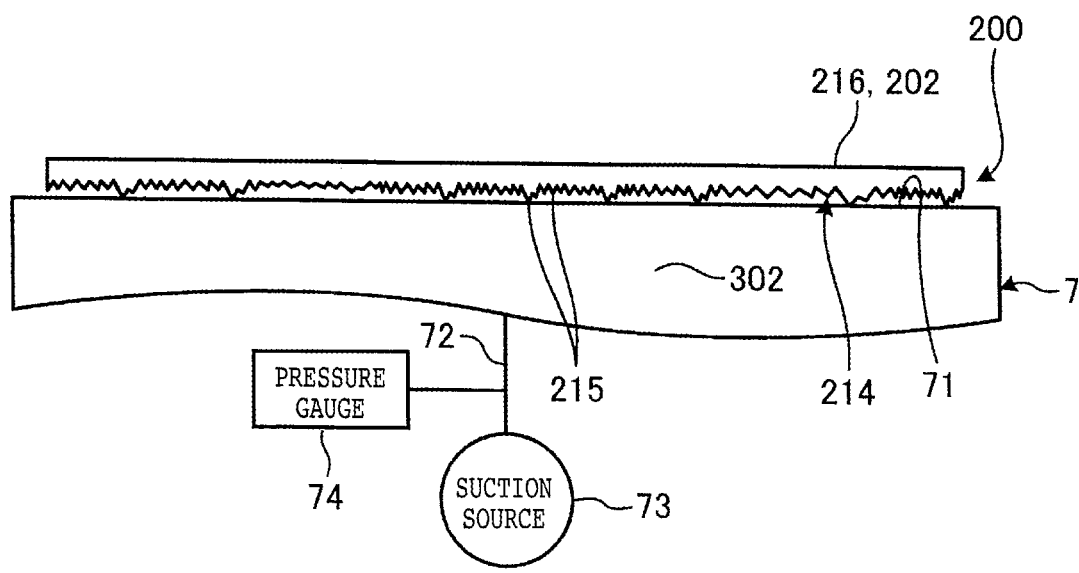
FIG. 12 is a side view schematically illustrating the state in which the upper surface of the wafer held by the holding table of the grinding apparatus according to the second embodiment is the flat surface.

A grinding apparatus according to a second embodiment of the present invention will be described on the basis of drawings. FIG. 11 is a side view schematically illustrating the state in which the upper surface of the wafer held by the holding table of the grinding apparatus according to the second embodiment is the separation surface. FIG. 12 is a side view schematically illustrating the state in which the upper surface of the wafer held by the holding table of the grinding apparatus according to the second embodiment is the flat surface. Regarding FIG. 11 and FIG. 12, the same part as that in the first embodiment is given the same numeral, and description thereof is omitted.

In a grinding apparatus 1 according to the second embodiment, the pressure gauge 74 disposed on the suction path 72 connected to the holding surface 71 of the holding table 7 positioned in the rough grinding region 302 is a detecting unit that allows determination as to whether the upper surface 216 of the wafer 200 held by the holding table 7 is the flat surface 202 or the separation surface 214. In other words, the pressure gauge 74 is a detecting unit that detects a physical quantity, i.e., the pressure (negative pressure) of the suction path 72, used for determination of the state of exposure of the separation surface 214.

The exposure determining unit 104 of the control unit 100 of the grinding apparatus 1 according to the second embodiment determines whether the upper surface 216 of the wafer 200 held by the holding table 7 is the flat surface 202 or the separation surface 214 on the basis of the measurement result of the pressure gauge 74 that is the detecting unit disposed on the suction path 72 connected to the holding surface 71 of the holding table 7 positioned in the rough grinding region 302. That is, the exposure determining unit 104 determines the state of exposure of the separation surface 214 on the basis of a physical quantity, i.e., the pressure (negative pressure) of the suction path 72 detected by the detecting unit.

In the second embodiment, the exposure determining unit 104 determines whether or not the pressure (negative pressure) measured by the pressure gauge 74 when the wafer 200 is sucked on the holding surface 71 of the holding table 7 positioned in the rough grinding region 302 as the measurement result of the pressure gauge 74 is less than a threshold defined in advance. It is desirable for the threshold to be a value smaller than the pressure (negative pressure) that is measured when the upper surface 216 of the wafer 200 held under suction on the holding surface 71 is the separation surface 214.

When the side of the separation surface 214 of the wafer 200 is sucked on the holding surface 71 of the holding table 7, a gap is generated between the holding surface 71 and the separation surface 214, and air flows into the suction path 72. Thus, the pressure of the suction path 72 does not sufficiently lower. That is, the negative pressure of the suction path 72 does not become sufficiently high. Thus, in the second embodiment, when the pressure (negative pressure) measured by the pressure gauge 74 when the wafer 200 is sucked on the holding surface 71 of the holding table 7 is less than the threshold, the exposure determining unit 104 determines that the state of exposure is the abnormal state in which the upper surface 216 of the wafer 200 held by the holding table 7 is the flat surface 202, that is, the separation surface 214 is not exposed upward. When the pressure (negative pressure) measured by the pressure gauge 74 when the wafer 200 is sucked on the holding surface 71 of the holding table 7 is not less than (that is, is equal to or higher than) the threshold, the exposure determining unit 104 determines that the state of exposure is the normal state in which the upper surface 216 of the wafer 200 held by the holding table 7 is the separation surface 214, that is, the separation surface 214 is exposed upward.

When the exposure determining unit 104 determines that the state of exposure is the normal state, the control unit 100 continues the processing operation of the grinding apparatus 1 as in the first embodiment. In the second embodiment, when the exposure determining unit 104 determines that the state of exposure is the abnormal state, the control unit 100 suspends the processing operation of the grinding apparatus 1 and causes the informing unit 103 to operate to execute informing the operator of the determination or the like. In this manner, in the second embodiment, when it is determined that the state of exposure is the abnormal state on the basis of the measurement result of the pressure gauge 74 disposed on the suction path 72 connected to the holding surface 71 of the holding table 7 positioned in the rough grinding region 302, the control unit 100 causes the informing unit 103 to operate to execute informing the operator of the determination or the like, as in the first embodiment.

In the grinding apparatus 1 according to the second embodiment, in the processing operation, the exposure determining unit 104 of the control unit 100 determines whether or not the pressure measured by the pressure gauge 74 disposed on the suction path 72 connected to the holding surface 71 of the holding table 7 positioned in the rough grinding region 302 is less than the threshold defined in advance. At this time, as illustrated in FIG. 11, when the upper surface 216 of the wafer 200 is the separation surface 214, the exposure determining unit 104 determines that the pressure measured by the pressure gauge 74 is not less than the threshold. Furthermore, as illustrated in FIG. 12, when the upper surface 216 of the wafer 200 is the flat surface 202, the exposure determining unit 104 determines that the pressure measured by the pressure gauge 74 is less than the threshold.

In the grinding apparatus 1, when determining that the pressure measured by the pressure gauge 74 disposed on the suction path 72 connected to the holding surface 71 of the holding table 7 positioned in the rough grinding region 302 is less than the threshold, the exposure determining unit 104 of the control unit 100 determines that the state of exposure is the abnormal state in which the separation surface 214 of the wafer 200 held by the holding table 7 is not exposed upward. Then, the control unit 100 suspends the processing operation of the grinding apparatus 1 and causes the informing unit 103 to operate to execute informing the operator of the determination or the like.

In the grinding apparatus 1, when determining that the pressure measured by the pressure gauge 74 disposed on the suction path 72 connected to the holding surface 71 of the holding table 7 positioned in the rough grinding region 302 is not less than (that is, is equal to or higher than) the threshold, the exposure determining unit 104 of the control unit 100 determines that the state of exposure is the normal state in which the separation surface 214 of the wafer 200 held by the holding table 7 is exposed upward, and the control unit 100 continues the processing operation of the grinding apparatus 1.

The grinding apparatus 1 according to the second embodiment includes the pressure gauge 74 that is the detecting unit that detects a physical quantity, i.e., the pressure (negative pressure) of the suction path 72, used for determination of the state of exposure of the separation surface 214. Thus, it is possible to determine whether the upper surface 216 of the wafer 200 held by the holding table 7 is the separation surface 214 or the flat surface 202. As a result, the grinding apparatus 1 provides an effect of decreasing the possibility that the separation surface 214 is held on the holding table 7 and the flat surface 202 that is the surface opposite to the separation surface 214 of the wafer 200 is ground.

Further, the grinding apparatus 1 according to the second embodiment determines whether or not the pressure (negative pressure) measured by the pressure gauge 74 is less than the threshold defined in advance, and determines that the state of exposure is the abnormal state in which the separation surface 214 is not exposed upward when determining that the pressure (negative pressure) is less than the threshold. As described above, the grinding apparatus 1 determines whether the upper surface 216 of the wafer 200 held by the holding table 7 is the separation surface 214 or the flat surface 202 by using the pressure gauge 74 that measures the pressure of the suction path 72 and has conventionally been used in order to check whether the wafer 200 is normally held under suction by the holding table 7. Thus, an abnormality can be detected without increasing the number of parts.

The recesses and projections 215 with surface roughness of approximately several tens of micrometers are present in the separation surface 214. Thus, the pressure measured by the pressure gauge 74 tends to notably change depending on whether or not the separation surface 214 is located on the holding surface 71. With use of this, the grinding apparatus 1 according to the second embodiment uses the pressure gauge 74 disposed on the suction path 72 connected to the holding surface 71 of the holding table 7 positioned in the rough grinding region 302 as the detecting unit that detects a physical quantity used for determination of the state of exposure of the separation surface 214. Thus, the state of exposure of the separation surface 214 can be accurately determined.

Third Embodiment

Figure 13:
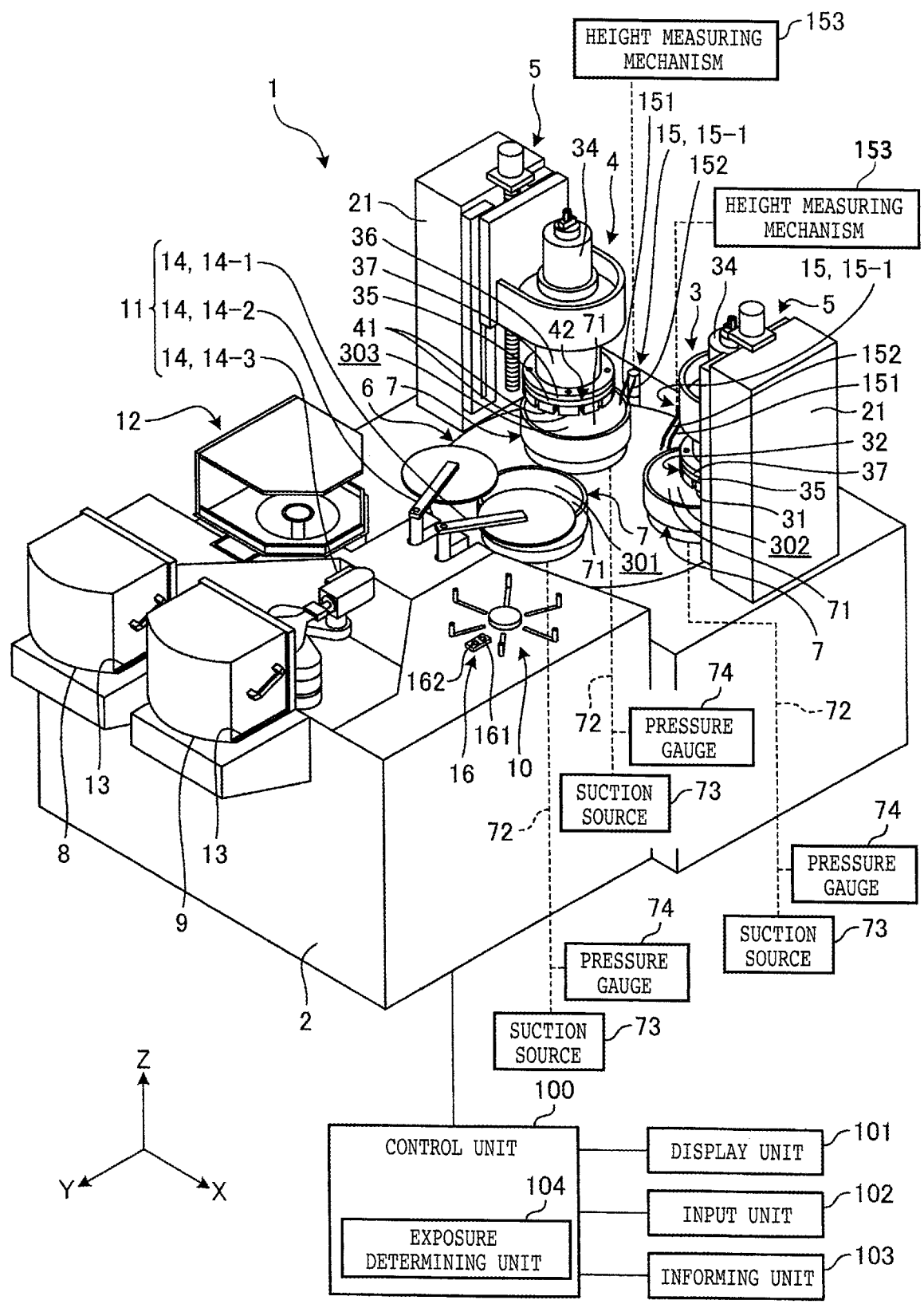
FIG. 13 is a perspective view illustrating a configuration example of a grinding apparatus according to a third embodiment.

A grinding apparatus according to a third embodiment of the present invention will be described on the basis of a drawing. FIG. 13 is a perspective view illustrating a configuration example of the grinding apparatus according to the third embodiment. Regarding FIG. 13, the same part as that in the first embodiment is given the same numeral, and description thereof is omitted.

A grinding apparatus 1 according to the third embodiment includes a detecting unit 16 that includes a light projecting part 161 that irradiates, with light, either the separation surface 214 or the flat surface 202 of the wafer 200 that is temporarily placed on the position adjustment unit 10 and for which position adjustment has been executed and a light receiving part 162 that receives reflected light reflected by the wafer 200 through the irradiation by the light projecting part 161. The detecting unit 16 outputs the amount of light received by the light receiving part 162 (what is equivalent to the intensity of received light) to the control unit 100. That is, the light projecting part 161 and the light receiving part 162 configure the detecting unit 16 that detects a physical quantity, i.e., the amount of received light (intensity of received light), used for determination of the state of exposure of the separation surface 214. When the separation surface 214 is opposed to the light receiving part 162 of the detecting unit 16, the light emitted by the light projecting part 161 is scattered by the recesses and projections 215, and the amount of received light lowers relative to the case in which the flat surface 202 is opposed to the light receiving part 162. With use of this, it is made possible to determine whether the upper surface 216 of the wafer 200 for which position adjustment has been executed by the position adjustment unit 10, i.e., the upper surface 216 of the wafer 200 to be held by the holding table 7, is the flat surface 202 or the separation surface 214 through outputting of the amount of received light received by the light receiving part 162 to the control unit 100 by the detecting unit 16. That is, determination of the state of exposure of the separation surface 214 is enabled.

The exposure determining unit 104 of the control unit 100 of the grinding apparatus 1 according to the third embodiment determines whether the upper surface 216 of the wafer 200 is the flat surface 202 or the separation surface 214 when the wafer 200 is later held by the holding table 7, on the basis of the amount of received light received by the light receiving part 162 of the detecting unit 16 disposed in the position adjustment unit 10. That is, the exposure determining unit 104 determines the state of exposure of the separation surface 214 on the basis of a physical quantity, i.e., the amount of received light detected by the detecting unit 16.

In the third embodiment, the exposure determining unit 104 determines whether or not the amount of received light received by the light receiving part 162 is less than a threshold defined in advance. It is desirable for the threshold to be a value smaller than the amount of received light when the upper surface 216 of the wafer 200 for which position adjustment has been executed by the position adjustment unit 10, i.e., the upper surface 216 of the wafer 200 to be held by the holding table 7, is the separation surface 214.

In the third embodiment, when the amount of received light received by the light receiving part 162 is less than the threshold, the exposure determining unit 104 determines that the surface of the wafer 200 irradiated with the light by the light projecting part 161 (surface on the side opposite to the upper surface 216 of the wafer 200 for which position adjustment has been executed by the position adjustment unit 10) is the separation surface 214. That is, when the amount of received light received by the light receiving part 162 is less than the threshold, the exposure determining unit 104 determines that the upper surface 216 of the wafer 200 for which position adjustment has been executed by the position adjustment unit 10, i.e., the upper surface 216 of the wafer 200 to be held by the holding table 7, is the flat surface 202, and determines that the state of exposure is the abnormal state in which the separation surface 214 is not exposed upward. When the amount of received light received by the light receiving part 162 is not less than (that is, is equal to or larger than) the threshold, the exposure determining unit 104 determines that the surface of the wafer 200 irradiated with the light by the light projecting part 161 (surface on the side opposite to the upper surface 216 of the wafer 200 for which position adjustment has been executed by the position adjustment unit 10) is the flat surface 202. That is, when the amount of received light received by the light receiving part 162 is not less than (that is, is equal to or larger than) the threshold, the exposure determining unit 104 determines that the upper surface 216 of the wafer 200 for which position adjustment has been executed by the position adjustment unit 10, i.e., the upper surface 216 of the wafer 200 to be held by the holding table 7, is the separation surface 214, and determines that the state of exposure is the normal state in which the separation surface 214 is exposed upward.

When the exposure determining unit 104 determines that the state of exposure is the normal state, the control unit 100 continues the processing operation of the grinding apparatus 1 as in the first embodiment. In the third embodiment, when the exposure determining unit 104 determines that the state of exposure is the abnormal state, the control unit 100 suspends the processing operation of the grinding apparatus 1 and causes the informing unit 103 to operate to execute informing the operator of the determination or the like. In this manner, in the third embodiment, when it is determined that the state of exposure is the abnormal state on the basis of the amount of received light received by the light receiving part 162, the control unit 100 causes the informing unit 103 to operate to execute informing the operator of the determination or the like, as in the first embodiment.

In the grinding apparatus 1 according to the third embodiment, in the processing operation, the detecting unit 16 irradiates the wafer 200 with light from the light projecting part 161 when the wafer 200 is temporarily placed on the position adjustment unit 10 and position adjustment is executed. In the grinding apparatus 1 according to the third embodiment, in the processing operation, the exposure determining unit 104 of the control unit 100 determines whether or not the amount of received light received by the light receiving part 162 when the wafer 200 that is temporarily placed on the position adjustment unit 10 and for which the position adjustment has been executed is irradiated with the light by the light projecting part 161 is less than the threshold defined in advance. At this time, when the upper surface 216 of the wafer 200 is the separation surface 214, the exposure determining unit 104 determines that the amount of received light is less than the threshold. Further, when the upper surface 216 of the wafer 200 is the flat surface 202, the exposure determining unit 104 determines that the amount of received light is less than the threshold.

In the grinding apparatus 1, when determining that the amount of received light received by the light receiving part 162 when the wafer 200 that is temporarily placed on the position adjustment unit 10 and for which position adjustment has been executed is irradiated with the light by the light projecting part 161 is less than the threshold, the exposure determining unit 104 of the control unit 100 determines that the state of exposure is the abnormal state in which the separation surface 214 of the wafer 200 to be held by the holding table 7 is not exposed upward. Then, the control unit 100 suspends the processing operation of the grinding apparatus 1 and causes the informing unit 103 to operate to execute informing the operator of the determination or the like.

In the grinding apparatus 1, when determining that the amount of received light received by the light receiving part 162 when the wafer 200 that is temporarily placed on the position adjustment unit 10 and for which position adjustment has been executed is irradiated with the light by the light projecting part 161 is not less than (that is, is equal to or larger than) the threshold, the exposure determining unit 104 of the control unit 100 determines that the state of exposure is the normal state in which the separation surface 214 of the wafer 200 to be held by the holding table 7 is exposed upward, and the control unit 100 continues the processing operation of the grinding apparatus 1.

The grinding apparatus 1 according to the third embodiment includes the detecting unit 16 that detects a physical quantity, i.e., the amount of received light, used for determination of the state of exposure of the separation surface 214 of the wafer 200 that is temporarily placed on the position adjustment unit 10 and for which position adjustment has been executed, i.e., the wafer 200 to be held by the holding table 7. Thus, it is possible to determine whether the upper surface 216 of the wafer 200 to be held by the holding table 7 is the separation surface 214 or the flat surface 202. As a result, the grinding apparatus 1 provides an effect of decreasing the possibility that the separation surface 214 is held on the holding table 7 and the flat surface 202 that is the surface opposite to the separation surface 214 of the wafer 200 is ground.

In the present invention, in the grinding apparatus 1 according to the third embodiment, after the exposure determining unit 104 of the control unit 100 has determined that the state of exposure is the abnormal state in which the separation surface 214 of the wafer 200 to be held by the holding table 7 is not exposed upward, the orientation of the wafer 200 that is temporarily placed on the position adjustment unit 10 and for which position adjustment has been executed may be inverted upside down by the conveying arm 14-3, the wafer 200 may be temporarily placed on the position adjustment unit 10 again, and the processing operation may be continued.

Fourth Embodiment

Figure 14:
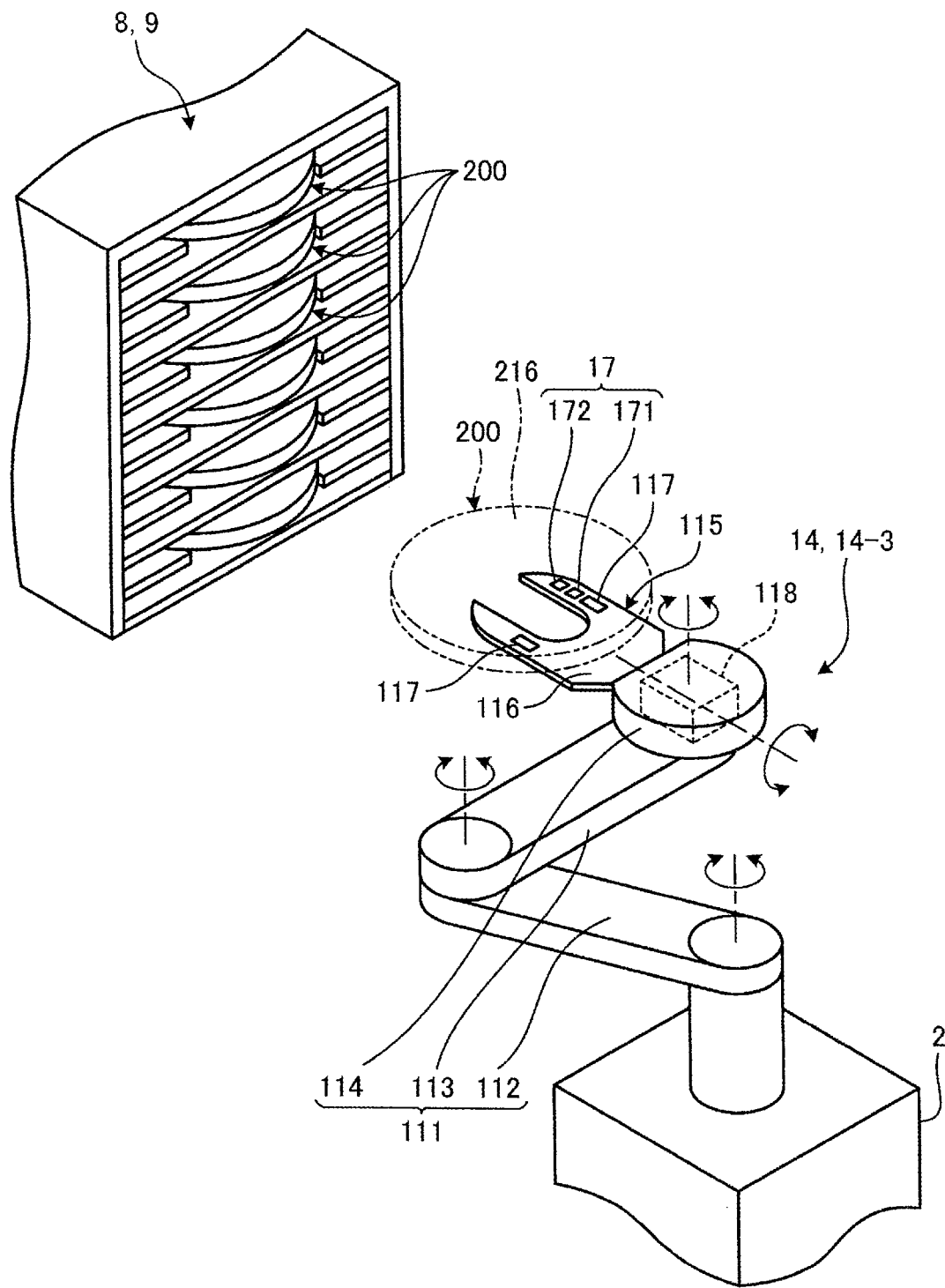
FIG. 14 is a perspective view illustrating a configuration example of the conveying arm of a grinding apparatus according to a fourth embodiment.

A grinding apparatus according to a fourth embodiment of the present invention will be described on the basis of a drawing. FIG. 14 is a perspective view illustrating a configuration example of the conveying arm of the grinding apparatus according to the fourth embodiment. Regarding FIG. 14, the same part as that in the first embodiment is given the same numeral, and description thereof is omitted.

A grinding apparatus 1 according to the fourth embodiment has a detecting unit 16 that includes a light projecting part 171 that is set on the U-shaped hand 115 of the conveying arm 14 of the conveying unit 11, that is opposed to the wafer 200 held under suction on the surface 116, which is the holding surface, and that irradiates either the separation surface 214 or the flat surface 202 of the wafer 200 with light and a light receiving part 172 that receives reflected light reflected by the wafer 200 through the irradiation by the light projecting part 171. The detecting unit 17 outputs the amount of light received by the light receiving part 172 (what is equivalent to the intensity of received light) to the control unit 100. That is, the light projecting part 171 and the light receiving part 172 configure the detecting unit 17 that detects a physical quantity, i.e., the amount of received light (intensity of received light), used for determination of the state of exposure of the separation surface 214. When the separation surface 214 is opposed to the light receiving part 172 of the detecting unit 17, the light emitted by the light projecting part 171 is scattered by the recesses and projections 215, and the amount of received light lowers relative to the case in which the flat surface 202 is opposed to the light receiving part 172. With use of this, it is made possible to detect whether the surface opposed to the light projecting part 171 in the wafer 200 held by the U-shaped hand 115 of the conveying arm 14 of the conveying unit 11 is the separation surface 214 and to determine whether the upper surface 216 of the wafer 200 to be held by the holding table 7 is the flat surface 202, through outputting of the amount of received light received by the light receiving part 172 to the control unit 100 by the detecting unit 17. That is, determination of the state of exposure of the separation surface 214 is enabled.

The exposure determining unit 104 of the control unit 100 of the grinding apparatus 1 according to the fourth embodiment determines whether the surface opposed to the light projecting part 171 is the flat surface 202 or the separation surface 214 on the basis of the amount of received light received by the light receiving part 172 of the detecting unit 17 set on the U-shaped hand 115 of the conveying arm 14. That is, the exposure determining unit 104 determines the state of exposure of the separation surface 214 on the basis of a physical quantity, i.e., the amount of received light detected by the detecting unit 17.

In the fourth embodiment, the exposure determining unit 104 determines whether or not the amount of received light received by the light receiving part 172 is less than a threshold defined in advance. It is desirable for the threshold to be a value smaller than the amount of received light when the surface of the wafer 200 opposed to the light projecting part 171 is the flat surface 202, that is, the upper surface 216 of the wafer 200 to be held by the holding table 7 is the separation surface 214.

In the fourth embodiment, when the amount of received light received by the light receiving part 172 is less than the threshold, the exposure determining unit 104 determines that the surface of the wafer 200 irradiated with the light by the light projecting part 171 is the separation surface 214. That is, when the amount of received light received by the light receiving part 172 is less than the threshold, the exposure determining unit 104 determines that the surface of the wafer 200 opposed to the light projecting part 171 is the separation surface 214, that is, determines that the upper surface 216 of the wafer 200 to be held by the holding table 7 is the flat surface 202, and determines that the state of exposure is the abnormal state in which the separation surface 214 is not exposed upward. When the amount of received light received by the light receiving part 172 is not less than (that is, is equal to or larger than) the threshold, the exposure determining unit 104 determines that the surface of the wafer 200 irradiated with the light by the light projecting part 171 is the flat surface 202. That is, when the amount of received light received by the light receiving part 172 is not less than (that is, is equal to or larger than) the threshold, the exposure determining unit 104 determines that the surface of the wafer 200 opposed to the light projecting part 171 is the flat surface 202, that is, determines that the upper surface 216 of the wafer 200 to be held by the holding table 7 is the separation surface 214, and determines that the state of exposure is the normal state in which the separation surface 214 is exposed upward.

In this manner, in the grinding apparatus 1 according to the fourth embodiment, the exposure determining unit 104 determines whether the separation surface 214 is exposed upward when the wafer 200 is held by the holding table 7, according to the amount of light received by the light receiving part 172 of the detecting unit 17, i.e., the detection result of the detecting unit 17.

When the exposure determining unit 104 determines that the state of exposure is the normal state, the control unit 100 continues the processing operation of the grinding apparatus 1 as in the first embodiment. In the fourth embodiment, when the exposure determining unit 104 determines that the state of exposure is the abnormal state, that is, determines that the separation surface 214 is not exposed upward when the wafer 200 is held by the holding table 7, the control unit 100 rotates the U-shaped hand 115 that holds under suction the wafer 200 in the conveying arm 14 by 180 degrees to invert the orientation of the wafer 200 upside down before placing the wafer 200 on the holding table 7, and continues the processing operation.

In the grinding apparatus 1 according to the fourth embodiment, in the processing operation, the detecting unit 17 irradiates the wafer 200 with light from the light projecting part 171 when the conveying arm 14 of the conveying unit 11 holds under suction the wafer 200 that has not yet undergone grinding processing on the surface 116 which is the holding surface of the U-shaped hand 115. In the grinding apparatus 1 according to the fourth embodiment, in the processing operation, the exposure determining unit 104 of the control unit 100 determines whether or not the amount of received light received by the light receiving part 172 when the wafer 200 that has not yet undergone grinding processing and that is held under suction on the surface 116 which is the holding surface of the U-shaped hand 115 of the conveying arm 14 of the conveying unit 11 is irradiated with the light by the light projecting part 171 is less than the threshold defined in advance. At this time, when the surface of the wafer 200 opposed to the light projecting part 171 is the flat surface 202, that is, the upper surface 216 of the wafer 200 to be held by the holding table 7 is the separation surface 214, the exposure determining unit 104 determines that the amount of received light is not less than the threshold. Furthermore, when the surface of the wafer 200 opposed to the light projecting part 171 is the separation surface 214, that is, the upper surface 216 of the wafer 200 to be held by the holding table 7 is the flat surface 202, the exposure determining unit 104 determines that the amount of received light is less than the threshold.

In the grinding apparatus 1, when determining that the amount of received light received by the light receiving part 172 when the wafer 200 that has not yet undergone grinding processing and that is held under suction on the surface 116 which is the holding surface of the U-shaped hand 115 of the conveying arm 14 of the conveying unit 11 is irradiated with the light by the light projecting part 171 is less than the threshold, the exposure determining unit 104 of the control unit 100 determines that the state of exposure is the abnormal state in which the separation surface 214 of the wafer 200 to be held by the holding table 7 is not exposed upward. In the processing operation, when it is determined that the state of exposure is the abnormal state, the grinding apparatus 1 according to the fourth embodiment inverts the orientation of the wafer 200 upside down by the conveying arm 14, temporarily places the wafer 200 on the position adjustment unit 10, and continues the processing operation.

In the grinding apparatus 1, when determining that the amount of received light received by the light receiving part 172 when the wafer 200 that has not yet undergone grinding processing and that is held under suction on the surface 116 which is the holding surface of the U-shaped hand 115 of the conveying arm 14 of the conveying unit 11 is irradiated with the light by the light projecting part 171 is not less than (that is, is equal to or larger than) the threshold, the exposure determining unit 104 of the control unit 100 determines that the state of exposure is the normal state in which the separation surface 214 of the wafer 200 to be held by the holding table 7 is exposed upward, and the control unit 100 continues the processing operation of the grinding apparatus 1.

The grinding apparatus 1 according to the fourth embodiment includes the detecting unit 17 that detects a physical quantity, i.e., the amount of received light, used for determination of the state of exposure of the separation surface 214 of the wafer 200 held under suction by the conveying arm 14 of the conveying unit 11, i.e., the wafer 200 to be held by the holding table 7. Thus, it is possible to determine whether the upper surface 216 of the wafer 200 to be held by the holding table 7 is the separation surface 214 or the flat surface 202. As a result, the grinding apparatus 1 provides an effect of decreasing the possibility that the separation surface 214 is held on the holding table 7 and the flat surface 202 that is the surface opposite to the separation surface 214 of the wafer 200 is ground.

Further, in the grinding apparatus 1 according to the fourth embodiment, the detecting unit 17 is disposed on the U-shaped hand 115 of the conveying arm 14 of the conveying unit 11. Thus, determination of the state of exposure of the separation surface 214 can be executed at the stage of conveyance before the wafer 200 is placed on the holding table 7, such as in a standby time of the conveying arm 14 in grinding processing of the previous wafer 200. As a result, in the grinding apparatus 1 according to the fourth embodiment, there is no necessity for detection and determination after placement of the wafer 200 on the holding table 7, and there is no fear that the holding table 7 is occupied and the productivity is lowered.

Moreover, in the grinding apparatus 1 according to the fourth embodiment, in the middle of conveying the wafer 200 that has not yet undergone grinding processing to the holding table 7, the wafer 200 can be inverted in such a manner as to be placed on the holding table 7 with the separation surface 214 exposed upward. As a result, the grinding apparatus 1 according to the fourth embodiment does not need a step in which the wafer 200 with respect to which the state of exposure is determined to be the abnormal state is returned to the cassette 8 or 9 without being processed and the operator inverts the wafer 200 upside down and sets it again, a step in which the operator manually inverts the orientation of the wafer 200 upside down every time the state of exposure is determined to be the abnormal state, and so forth.

The present invention is not limited to the above-described embodiments. That is, the present invention can be carried out with various modifications without departing from the gist of the present invention. The grinding apparatus 1 of the present invention may employ, as the upper surface height measuring instrument 15-1, a height measuring instrument of a contactless type that measures the upper surface height of the wafer by irradiating the upper surface 216 of the wafer 200 with light and receiving reflected light from the upper surface 216 of the wafer 200.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A grinding apparatus that grinds a separation surface having recesses and projections in a wafer generated by being separated from an ingot, the grinding apparatus comprising:
   a holding table that holds the wafer;
   a grinding unit that grinds a separation surface of the wafer held by the holding table;
   a detecting unit that detects a physical quantity used for determination of a state of exposure of the separation surface, wherein the separation surface is exposed when it faces the grinding unit and not exposed when it faces the holding table; and a control unit having an exposure determining unit that determines, prior to a grinding operation by the grinding unit, the state of exposure of the separation surface on a basis of the physical quantity detected by the detecting unit.

2. The grinding apparatus according to claim 1, wherein the detecting unit has an upper surface height detector that measures an upper surface height of the wafer held by the holding table, and the exposure determining unit determines that the state of exposure is an abnormal state when the separation surface is not exposed, when a difference in the upper surface height among a plurality of places obtained by measurement of the plurality of places by the upper surface height detector is less than a threshold difference in height.

3. The grinding apparatus according to claim 1, wherein the detecting unit has a pressure gauge that measures negative pressure of a suction path when the wafer is sucked by a holding surface of the holding table, and the exposure determining unit determines that the state of exposure is an abnormal state when the separation surface is not exposed, when the negative pressure measured by the pressure gauge when the wafer is sucked is less than a threshold amount of pressure.

4. The grinding apparatus according to claim 2, wherein, when it is determined that the state of exposure is the abnormal state by the exposure determining unit, the control unit informs an operator of the determination of the abnormal state.

5. The grinding apparatus according to claim 3, wherein, when it is determined that the state of exposure is the abnormal state by the exposure determining unit, the control unit informs an operator of the determination of the abnormal state.

6. The grinding apparatus according to claim 1, further comprising:

a position adjustment unit on which the wafer is to be temporarily placed, wherein the detecting unit has a light projecting part that irradiates either one of surfaces of the wafer temporarily placed on the position adjustment unit with light, and a light receiving part that receives reflected light reflected by the wafer, and, when an amount of light received by the light receiving part is less than a threshold amount of light, the exposure determining unit determines that the surface irradiated with the light by the light projecting part is the separation surface and, on a basis of a result of the determination, determines whether or not the separation surface is exposed when the wafer is held by the holding table.

7. The grinding apparatus according to claim 1, further comprising:

a cassette setting pedestal on which a cassette capable of housing a plurality of the wafers is set; and a conveying unit including at least one conveying arm that conveys the wafer from the cassette to the holding table, wherein the detecting unit has a light projecting part that is set on the conveying unit and irradiates either one of surfaces of the wafer with light, and a light receiving part that is set on the conveying unit and receives reflected light reflected by the wafer, and, when an amount of light received by the light receiving part is less than a threshold amount of light, the exposure determining unit determines that the surface irradiated with the light by the light projecting part is the separation surface and, on a basis of a result of the determination, determines whether or not the separation surface is exposed when the wafer is held by the holding table.

8. The grinding apparatus according to claim 7, wherein the conveying arm has a holding surface that holds the wafer, an arm part connected to the holding surface, and a drive part that is set in the arm part and is capable of inverting an orientation of the holding surface, and the control unit inverts the orientation of the holding surface before placing the wafer on the holding table, when the exposure determining unit determines that the separation surface is not exposed.

9. The grinding apparatus according to claim 7, wherein the light projecting part and the light receiving part are both on the at least one conveying arm of the conveying unit.

\* \* \* \* \*